(12) United States Patent
Nakazawa et al.

(10) Patent No.: US 7,776,672 B2
(45) Date of Patent: Aug. 17, 2010

(54) SEMICONDUCTOR DEVICE AND MANUFACTURING METHOD THEREOF

(75) Inventors: Haruo Nakazawa, Matsumoto (JP);
Kazuo Shimoyama, Matsumoto (JP);
Manabu Takei, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 734 days.

(21) Appl. No.: 11/389,495

(22) Filed: Mar. 27, 2006

(65) Prior Publication Data

US 2006/0249797 A1    Nov. 9, 2006

Related U.S. Application Data

(63) Continuation-in-part of application No. 11/208,459, filed on Aug. 19, 2005.

(30) Foreign Application Priority Data

| Aug. 19, 2004 | (JP) | ............................. 2004-240094 |
| Oct. 27, 2004 | (JP) | ............................. 2004-312590 |
| Jan. 25, 2005 | (JP) | ............................. 2005-017486 |
| Mar. 25, 2005 | (JP) | ............................. 2005-088479 |
| Mar. 28, 2005 | (JP) | ............................. 2005-090662 |

(51) Int. Cl.
*H01L 21/336*    (2006.01)

(52) U.S. Cl. .................. 438/197; 438/133; 438/400; 438/430; 438/433; 438/435

(58) Field of Classification Search .................. 438/133, 438/197, 400, 430, 433, 435

See application file for complete search history.

(56) References Cited

U.S. PATENT DOCUMENTS

| 4,089,021 A | 5/1978 | Sato et al. |
| 4,362,599 A | 12/1982 | Imaizumi et al. |

(Continued)

FOREIGN PATENT DOCUMENTS

JP    2-22869 A    1/1990

(Continued)

OTHER PUBLICATIONS

Bean, K.E. et al.; "Dielectric Isolation: Comprehensive, Current and Future"; Journal of the Electrochemical Society; Jan. 1977; pp. 5C-12C.

*Primary Examiner*—Long Pham
(74) *Attorney, Agent, or Firm*—Rossi, Kimms & McDowell LLP

(57) ABSTRACT

On the top surface of a thin semiconductor wafer, top surface structures forming a semiconductor chip are formed. The top surface of the wafer is affixed to a supporting substrate with a double-sided adhesive tape. Then, from the bottom surface of the thin semiconductor wafer, a trench, which becomes a scribing line, is formed by wet anisotropic etching so that side walls of the trench are exposed. On the side walls of the trench with the crystal face exposed, an isolation layer with a conductivity type different from that of the semiconductor wafer for holding a reverse breakdown voltage is formed simultaneously with a collector region of the bottom surface diffused layer by ion implantation, followed by annealing with laser irradiation. The side walls form a substantially V-shaped or trapezoidal-shaped cross section, with an angle of the side wall relative to the supporting substrate being 30-70°. The double-sided adhesive tape is then removed from the top surface to produce semiconductor chips. With such a manufacturing method, a reverse-blocking semiconductor device having high reliability can be formed.

14 Claims, 14 Drawing Sheets

U.S. PATENT DOCUMENTS

| | | | |
|---|---|---|---|
| 4,904,609 A * | 2/1990 | Temple | 438/140 |
| 5,688,702 A | 11/1997 | Nakagawa et al. | |
| 6,897,118 B1 * | 5/2005 | Poon et al. | 438/303 |
| 2006/0038206 A1 | 2/2006 | Shimoyama et al. | |

FOREIGN PATENT DOCUMENTS

| | | |
|---|---|---|
| JP | 10-25612 A | 9/1998 |
| JP | 10-256152 A | 9/1998 |
| JP | 2001-185727 A | 7/2001 |
| JP | 2002-76017 A | 3/2002 |
| JP | 2005-64301 A | 3/2005 |
| JP | 2006059876 * | 3/2006 |

* cited by examiner

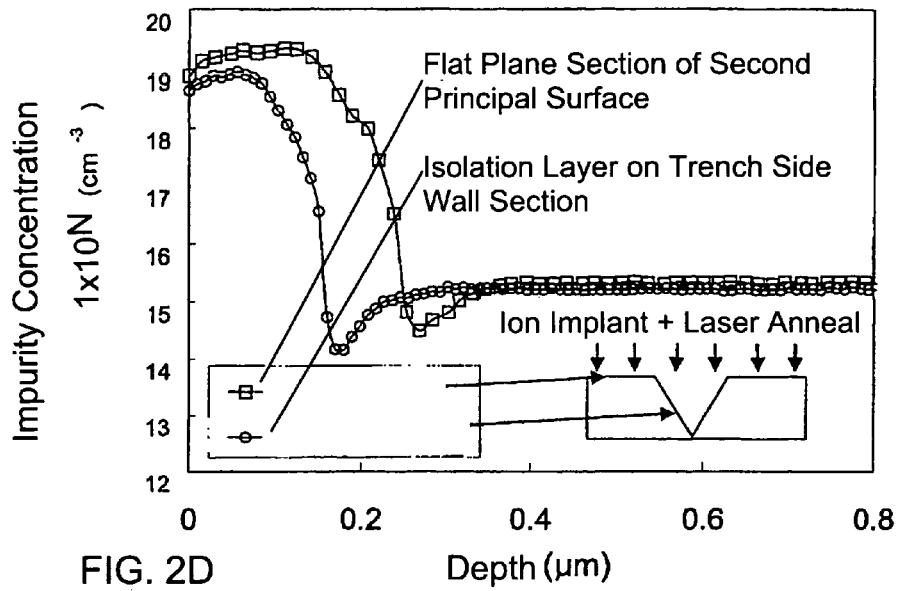
FIG. 2D
FIG. 3
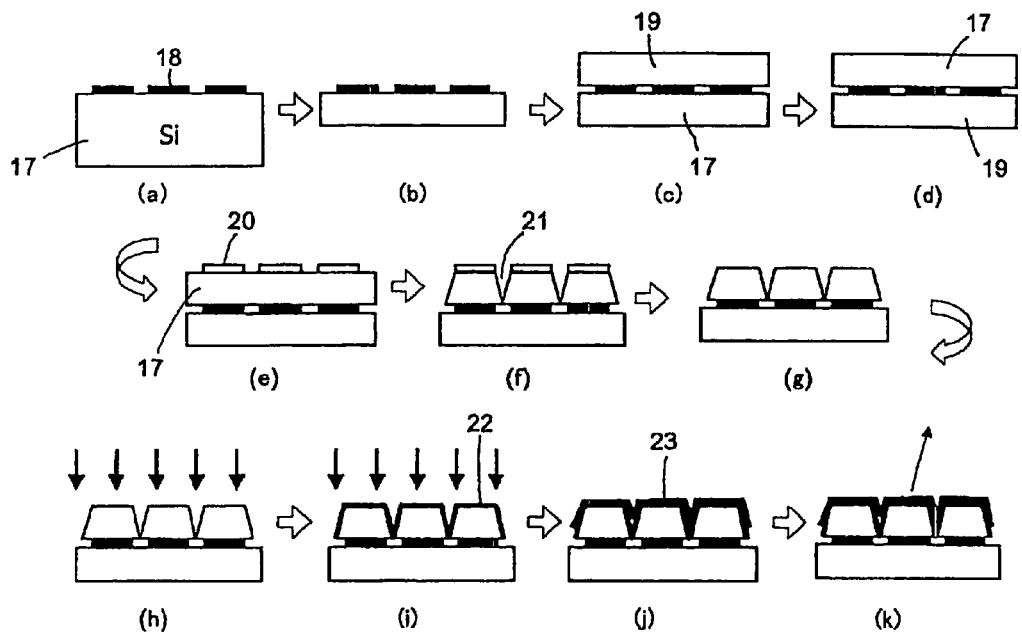

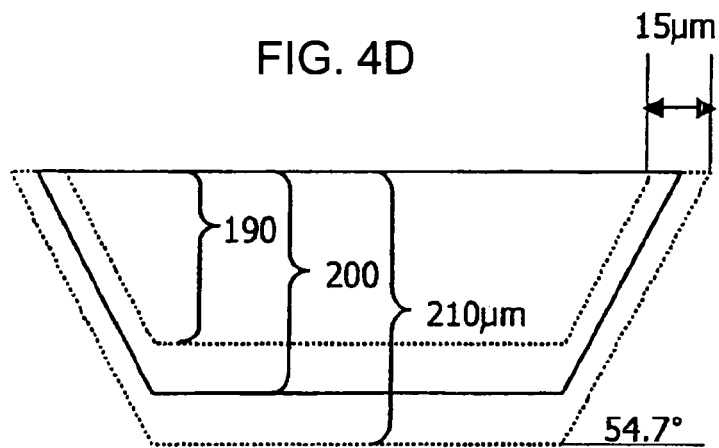
FIG. 4D
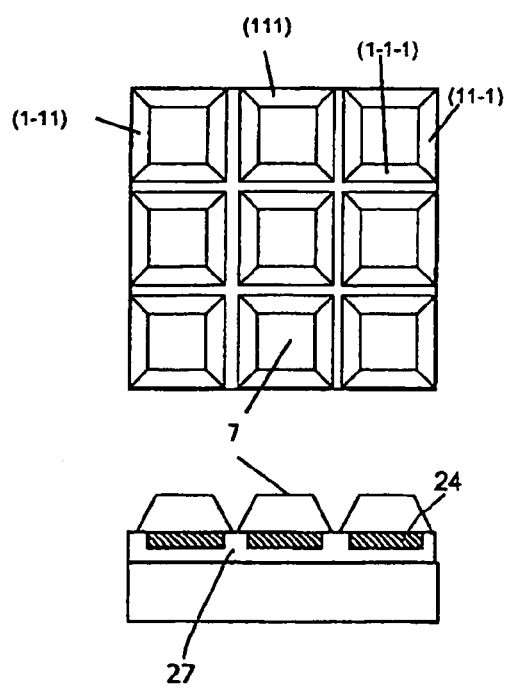
FIG. 7A
FIG. 7B
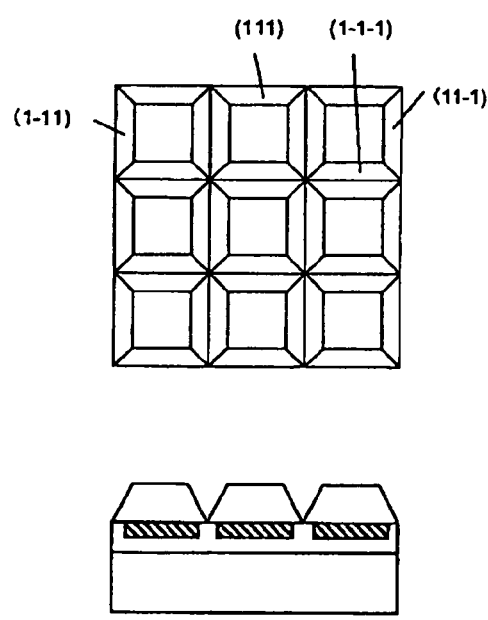
FIG. 7C
FIG. 7D

FIG. 9
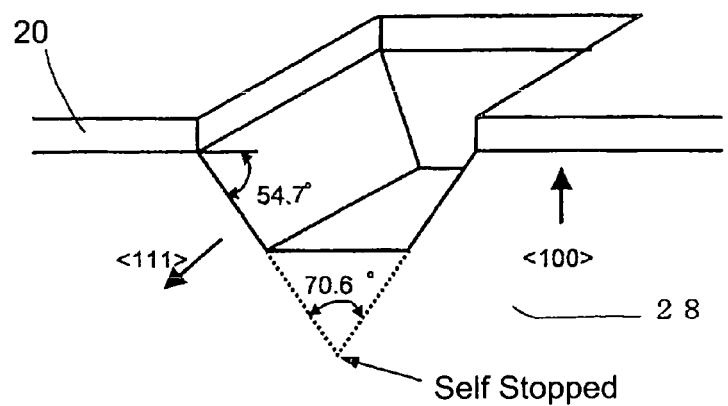
FIG. 13A
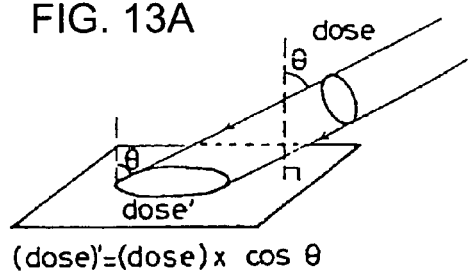
(dose)' = (dose) x cos θ
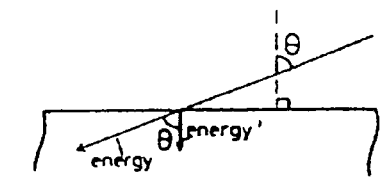
(energy)' = (energy) x cos θ
FIG. 13B
FIG. 14
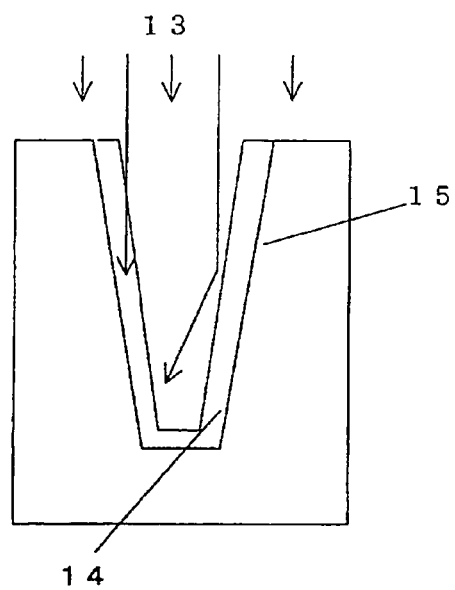

US 7,776,672 B2

SEMICONDUCTOR DEVICE AND MANUFACTURING METHOD THEREOF

This is a continuation-in-part of U.S. patent application Ser. No. 11/208,459 filed 19 Aug. 2005, now U.S. Pat. No. 7,741,192, the entire disclosure of which is incorporated herein by reference.

BACKGROUND

In a semiconductor device of a reverse-blocking type, a reverse-blocking capability equivalent to a forward-blocking capability is required. For securing the reverse-blocking capability, it is necessary to make a p-n junction holding a reverse breakdown voltage to extend from the bottom surface of a semiconductor chip to its top surface. A diffused layer for forming the p-n junction extending from the bottom surface to the top surface is an isolation layer.

FIG. 10 illustrates the manufacturing steps of forming an isolation layer in a related reverse-blocking IGBT presenting its principal part. The method is that of forming the isolation layer by coating and diffusion. First, on a semiconductor wafer 1, an oxide film 2 having a film thickness of the order of 2.5 μm is formed by thermal oxidation as a dopant diffusion mask (step (a)). Next, the oxide film 2 is subjected to patterning and etching, by which an opening 3 with a diameter of the order of 100 μm is formed for forming an isolation layer (step (b)). Thereafter, the opening 3 is coated with a boron source 4 and high temperature and long time heat treatment of the semiconductor wafer 1 is carried out in a diffusion furnace to form a p-type diffused layer with a thickness of the order of several hundreds micrometers (step (c)). The p-type diffused layer becomes the isolation layer 5.

Thereafter, although not particularly illustrated, after a top surface structure is formed, the semiconductor wafer 1 is made thinner by grinding its bottom surface until the bottom surface 6 reaches the isolation layer 5. On the ground bottom surface 6, a bottom surface structure made up of a p$^+$ collector region and a collector electrode is formed. Subsequently, the semiconductor wafer 1 is cut at a scribing line positioned at the center of the isolation layer 5 to form an IGBT chip.

FIG. 11 is a cross-sectional view showing the principal part of the related reverse-blocking IGBT whose isolation layer 5 is formed according to the manufacturing steps shown in FIG. 10. Reference numeral 8 denotes a p$^+$ well region, 10 denotes a p voltage withstanding region, 9 denotes a gate insulator film, 12 denotes a field oxide film, 7 denotes a p$^+$ collector region and 11 denotes a dicing face. Illustration of an emitter region selectively formed on the surface in the p well region 8, a gate electrode on the gate insulator film 9, an interlayer insulator film further covering the gate electrode, an emitter electrode on the interlayer insulator film, a field plate formed on the field oxide film 12, and a collector electrode covering the collector region 7 are not illustrated.

The isolation layer is formed in another way in a related reverse-blocking IGBT by providing a trench and forming a diffusion layer on the side wall of the trench as shown in FIGS. 12A-12C. Here, on a semiconductor wafer 14, an etching mask is first formed with a thick oxide film 13 having a thickness of several micrometers (FIG. 12A). Next, a trench 15 having a depth of the order of several hundreds micrometers is formed by dry etching (FIG. 12B). Then, impurities, such as dopant gas 16, which can be diborane ($B_2H_6$), is introduced into the side wall of the trench 15 via vapor phase diffusion to form an isolation layer 17 of a p-type diffused layer (FIG. 12C). In this case, after the trench 15 is filled back with a reinforcing material of an epitaxial silicon film or a polysilicon film, dicing is carried out along a scribing line, by which an IGBT chip is cut from the semiconductor wafer 14.

Such a method of providing the trench 15 and forming the isolation layer 17 on the side wall of the trench 15 is disclosed in JP-A-2-22869, JP-A-2001-185727, and JP-A-2002-76017. JP-A-2-22869 discloses forming a trench from the top surface of a device to a bottom side junction so as to surround an active layer, and then forming a diffusion layer on the side wall of the trench to form an isolation layer with an end of the bottom side junction of the device made extending to the top surface of the device. JP-A-2001-185727 and JP-A-2002-76017 disclose, like JP-A-2-22869, forming a trench from the top surface of the device to a bottom junction and then forming a diffused layer on the side wall of the trench to thereby form a device having a reverse-blocking capability.

In the method of forming the isolation layer in the reverse-blocking IGBT shown in FIGS. 10 and 11, a long time diffusion treatment in a high temperature environment is necessary for diffusing boron from the boron source 4 (a liquid diffusion source of boron) to coat on the surface to form the isolation layer 5 with a diffusion depth of the order of several hundreds micrometers. This, however, can fatigue quartz fixtures, forming a diffusion furnace, such as a quartz board, a quartz tube, and a quartz nozzle, and contaminate by foreign materials from a heater and strength reduction due to devitrification of the quartz fixtures.

Moreover, in forming the isolation layer 5 by the coating and diffusion method, it becomes necessary to form a masking oxide film (the oxide film 2). The masking oxide film needs to be thick and high quality to withstand long time boron diffusion. A silicon oxide film with high resistance of mask, that is, with a high quality, can be formed by a thermal oxidation method. However, in order that no boron atoms penetrate through the masking oxide film in the high temperature and long time (at 1300° C. for 200 hours, for example) diffusion processing of the isolation layer 5 with boron, it is necessary to form a thermal oxide film with a film thickness of about 2.5 μm. For forming such a thermal oxide film with the film thickness of about 2.5 μm, an oxidation time required at an oxidation temperature of 1150° C., for example, is about 200 hours in the dry atmosphere of oxygen by which a high quality oxide film can be obtained.

Even with wet or pyrogenic oxidation, which is known to shorten oxidation time in comparison with the dry oxidation, albeit with slight inferiority in quality of an obtained oxidized film, a long oxidation time of about 15 hours is still necessary. Furthermore, in the above oxidation processing, a large amount of oxygen is introduced into a silicon wafer. This introduces crystal defects, such as oxygen precipitates and oxidation-induced stacking faults (OSF), and produces oxygen donors to thereby cause adverse effects, such as characteristics deterioration and reliability degradation of the device.

Furthermore, also in the step of diffusing boron carried out after the boron source 4 has been coated, the above high temperature and long time diffusion processing is usually carried out under an oxidizing atmosphere. This causes oxygen atoms to be introduced into crystal lattices in the wafer as interstitial oxygen atoms. Thus, also in the diffusion step, crystal defects, such as oxygen precipitates, oxygen donor production, OSF, and slip dislocations are introduced. It is known that a leak current is increased in a p-n junction formed in a wafer with such crystal defects and a breakdown voltage and reliability are significantly degraded in an insulator film formed on the wafer by thermal oxidation. Moreover, oxygen atoms taken in during diffusion processing are made to become donors by another heat treatment to cause an adverse effect of lowering the breakdown voltage.

In the method of forming the isolation layer shown in FIGS. 10 and 11, approximately isotropic diffusion of boron progresses toward a silicon bulk from the opening of the masking oxide film. Thus, the boron diffusion up to 200 μm in the depth direction causes the boron to be inevitably diffused also in the lateral direction on the order of 180 μm. This causes an adverse effect on reduction in a device pitch and a chip size.

In the manufacturing method shown in FIGS. 12A-12C, the trench 15 is formed by dry etching and boron is introduced into the side wall of the formed trench 15 to form the isolation layer 17. Thereafter, the trench 15 is filled with the reinforcing material such as an insulator film or a semiconductor film. Since a trench with a high aspect ratio can be formed, the forming method shown in FIGS. 12A-12C is more advantageous for reducing a device pitch as compared with the forming method shown in FIG. 10. However, the processing time required for etching to a depth of the order of 200 μm is on the order of as long as 100 minutes per one wafer when a typical dry etching device is used. This brings adverse effects such as an increase in a lead time and the number of maintenance. Moreover, when a deep trench is formed by dry etching with a silicon oxide ($SiO_2$) film used as a mask, a thick silicon oxide film with a thickness of several micrometers is necessary because the etching selectivity is on the order of 50. The thick silicon oxide film causes adverse effects such as increase in a cost and reduction in a rate of acceptable products due to introduction of process induced crystal defects, such as OSFs and oxygen precipitates.

Further, in the process of forming an isolation layer in which a deep trench with a high aspect ratio formed by dry etching, there is a problem in that residues, such as a chemical residue 18 and a photo-resist residue 19 are left in the trench as shown in FIG. 12D to cause adverse effects, such as reduction in yield and reduction in reliability. When a dopant such as phosphorus or boron is introduced into the side wall of a trench, the vertically provided side wall of the trench causes the dopant introduction to be usually carried out by implanting dopant ions with the wafer inclined.

Introduction of a dopant into the side wall of the trench having a high aspect ratio is carried out by ion implantation incident at a slight angle of inclination (ion implantation from the top surface of a wafer onto a side wall of a trench having a large angle of inclination to the bottom surface of the wafer). This causes, as shown in FIGS. 13A and 13B, and 14, each being a schematic diagram for explaining problems in ion implantation incident at a slight angle of inclination, adverse effects, such as reduction in an effective dose (and an accompanied increase in an implantation time), a decrease in an effective projected range, a dose loss due to presence of a screen oxide film 14, and reduction in implantation uniformity. Moreover, in a side wall 15 of a trench, a dose and a depth of implanted dopant ions 13 are reduced compared with those to the top surface of the wafer as a principal surface. Furthermore, implanted dopant ions 13 are sometimes absorbed in the screen oxide film 14, reflected, and re-emitted to cause a dose loss. In addition, as shown in FIG. 6A as a characteristic diagram showing a relationship between a angle of inclination and a relative ion implantation time, for a trench formed by ordinary dry etching to have a side wall with a large angle of inclination of 80° or more to the bottom surface, a very long implantation time is required when an ion beam is made incident vertically to a wafer. Therefore, as a measure taken for effectively introducing an impurity into a trench having a high aspect ratio, vapor phase diffusion is used instead of implanting dopant ions into a wafer. In the vapor phase diffusion, a wafer is exposed to a gasified atmosphere of a dopant, such as $PH_3$ (phosphine) or $B_2H_6$ (diborane). The vapor phase diffusion, however, is inferior in fine controllability of dose as compared with ion implantation. Moreover, doses of dopant ions that can be introduced are often limited by their solubility limits.

Moreover, when a trench having a high aspect ratio is filled with an insulator film, a space referred to as a void is produced in the trench to cause a problem, such as reduction in reliability. When a deep trench is formed by dry etching, the surface of a wafer is exposed to a plasma atmosphere for a long time. This causes a plasma damage of the wafer, which degrades the device characteristics. In particular, a gate structure in an IGBT is susceptible to plasma damage. Therefore, the trench formation by dry etching is limited to a formation step carried out before a gate structure formation step. Furthermore, even after the gate structure has been formed, there still remains many semiconductor manufacturing process steps that must be undergone, such as a formation step of an emitter structure and a formation step of a passivation layer. When such processing steps are carried out with the formed trench left exposed, residues of resists and chemicals collected therein can cause the product to malfunction. Hence, the trench must be filled with a semiconductor film or an insulator film, which increases the manufacturing cost. Furthermore, when a trench formed by dry etching with a high aspect ratio is filled with an insulator film or a semiconductor film, a space referred to as a void is produced in the trench to sometimes cause a reliability problem.

Moreover, in forming an isolation layer by coating and diffusion, a section where the collector diffused layer and the diffused layer of the isolation layer connect with each other forms a sharp angle at the edge of the bottom of the chip. This can degrade the breakdown voltage due to electric field concentration. Furthermore, when a V-shaped trench is formed by etching, carried out from a first principal surface (top surface) side on which a MOS gate structure is formed, a device pitch is increased. In addition, the section where the collector diffused layer and the diffused layer of the isolation layer connect with each other forms a sharp angle at the edge of the bottom of the chip. This can also degrade the breakdown voltage due to electric field concentration. Moreover, a vertically formed trench tends to cause a laser beam to be incident parallel to a trench side wall to make it more difficult to activate the dopant impurities at the side wall.

Accordingly, there still remains a need for improving the manufacturing process for a semiconductor device, where dopant ions implanted into a side wall of a trench can be more readily activated. There still remains a need for a semiconductor device having high reliability, a small device pitch and a small chip size. Moreover, there still remains a need for improving the manufacturing a semiconductor device, where an isolation layer can be formed without carrying out high temperature and long time diffusion processing and long time oxidation processing. The present invention addresses these needs.

SUMMARY OF THE INVENTION

The present invention relates to a power semiconductor device, such as a power conversion device, and a manufacturing method thereof. In particular, the present invention relates to a method of forming an isolation layer in a bidirectional device or a reverse-blocking device having bidirectional voltage withstanding characteristics, or to formation of trenches of a sensor, an actuator, and a solar cell to which an MEMS (Micro-Electro-Mechanical-System) technology is applied.

One aspect of the present invention is a method of manufacturing a semiconductor device. Here, the method can include forming a trench having a substantially V-shaped or trapezoidal-shape cross section, in a second principal surface of a first conductivity type semiconductor substrate having the first principal surface and a second principal surface, introducing a second conductivity type impurity into a side wall of the trench, and activating the impurity by laser irradiation. The side wall of the trench is formed to have an angle of inclination of 70° or less relative to the second principal surface. More specifically, the side wall of the trench is formed so as to have an angle of inclination between 30° and 70° relative to the first principal surface.

Another aspect of the present invention is a semiconductor device having a substrate with a first principle surface and a second principle surface. A trench is formed in one of the first principle surface or the second principle surface. A doped semiconductor layer is on the trench. The trench has a substantially V-shaped or trapezoidal-shaped cross section and has side walls that extend from the one principle surface at an incline. The angle of inclination of the side walls relative to the other principle surface is at least 30° but not greater than 70°.

Another aspect of the present invention is a semiconductor device having a second conductivity type base region selectively provided in a surface region on a first principal surface of a first conductivity type semiconductor substrate, a first conductivity type emitter region selectively provided in a surface region of the base region, and a MOS gate structure. The MOS gate structure includes a gate insulator film provided on a surface of a section of the base region and the gate electrode provided on the gate insulating film. The section is positioned between the semiconductor substrate and the emitter region. A gate electrode can be provided on the gate insulator film. An emitter electrode can contact with the emitter region and the base region. A second conductivity type collector layer can be provided on a surface of a second principal surface of the semiconductor substrate. A collector electrode can be in contact with the collector layer. A second conductivity type isolation layer can surround the MOS gate structure, extend to the first principal surface from the second principal surface while being inclined to the first principal surface, and be coupled to the collector layer. The isolation layer can be covered with the collector electrode.

Another aspect of the present invention is a method of manufacturing the above semiconductor device. The method can include forming the MOS gate structure on the first principal surface of the first conductivity type semiconductor substrate, covering the second principal surface of the first conductivity type semiconductor substrate with a mask having openings of a desired pattern along the <110> direction, forming a trench having a V-shaped or trapezoidal-shape cross section in the semiconductor substrate from the second principal surface side, by wet anisotropic etching with an alkaline solution, sections of the second principal surface of the semiconductor substrate not covered by the mask, and forming the second conductivity type isolation layer and a diffused layer on the second principal surface by introducing a second conductivity type impurity into a side wall of the trench and the second principal surface.

Another aspect of the present invention is a method of manufacturing a semiconductor device. The method can include forming a plurality of diffused layers, a first main electrode and a control electrode on a first principal surface side of a semiconductor wafer, thinning the semiconductor wafer by grinding a second principal surface of the semiconductor wafer, affixing the first principal surface side to a supporting substrate with an adhesive layer, forming a trench that extends to the diffused layer on the first principal surface side from a second principal surface side of the thinned semiconductor wafer, forming an isolation layer on an entire area of a side wall of the trench and a diffused layer on the second principal surface side on the second principal surface, each of the isolation layer and the diffused layer having the same conductivity type as the diffused layer on the first principal surface side, forming a second main electrode in contact with the diffused layer on the second principal surface side and the isolation layer, and removing the adhesive layer from the thinned semiconductor wafer to provide the semiconductor wafer as a semiconductor chip.

The crystal face of each of the first principal surface and the second principal surface can be a $\{100\}$ plane, and the crystal faces of the side wall of the trench and the isolation layer can be a $\{111\}$ plane. The laser irradiation can be carried out with a laser beam made incident onto the second principal surface of the semiconductor substrate at an angle of incidence up to $\pm 30°$ to the normal to the second principal surface. The laser irradiation can be carried out with a focal point position of a laser beam made to come on the side wall of the trench so that no molten crystal mark or work mark appears on the first principal surface of the semiconductor substrate.

The isolation layer can be an impurity layer formed by introducing a second conductivity type impurity into the side wall of the $\{111\}$ plane of a trench formed in the semiconductor substrate from the second principal surface, and the second conductivity type isolation layer can have an angle of inclination of 125.3° on the second principal surface side.

The trench can be formed so as to be inclined at an angle of 125.3° relative to the second principal surface, and the second conductivity type impurity can be introduced into the side wall by ion implantation. The collector electrode can cover the second conductivity type isolation layer.

The mask can be made of at least one of a silicon oxide film, a silicon nitride film, an SOG film, and an alkali resistant resist film. The silicon oxide film and the silicon nitride film can be formed by plasma or atmospheric pressure CVD, and the SOG film can be formed by spin coating.

The trench can be formed by wet anisotropic etching. The trench can extend to the first principal surface. The etching of the trench can be stopped at a silicon oxide film or a silicon nitride film formed on the first principal surface. The isolation layer and the diffused layer on the second principal surface side can be formed by ion implantation and low temperature annealing at 550° C. or below. The isolation layer and the diffused layer on the second principal surface side can be formed by ion implantation and laser annealing.

The irradiation energy density of the laser beam can be 0.25 to 5.0 Joule/cm$^2$ from a YLF2ω laser or a YAG2ω laser, with which the entire surface of the second principal surface is irradiated with a delay time for second irradiation given as 0 to 5000.

When the crystal face of the side wall of the trench is a $\{111\}$ plane, the crystal face is inclined at 35.3° to the plane perpendicular to the second principal surface. Hence, a laser beam made incident onto the second principal surface of the semiconductor substrate at an angle of incidence up to 30° to the normal to the second principal surface enables laser irradiation onto both of the side walls of the trench.

BRIEF DESCRIPTION OF THE DRAWINGS

FIG. 2D is a characteristic diagram showing results of carrier concentration profile measurements respectively carried out about the flat plane section and the trench side wall section of a wafer with a V-shaped trench formed by wet anisotropic etching with an alkaline solution.

FIG. 3 is schematically illustrates the manufacturing steps for forming the reverse-blocking IGBT according to the invention.

FIG. 4D is a partial cross-sectional view illustrating effect of variation in the thickness of a wafer on spacing between chips.

FIGS. 7A and 7B illustrate a wafer in a plan view and a cross-sectional view where the spacing between chips is larger.

FIGS. 7C and 7D illustrate a wafer in a plan view and a cross-sectional view where the spacing between chips is smaller.

FIG. 9 is a schematic perspective view showing wet anisotropic etching of silicon with an alkaline solution according to the present invention.

FIGS. 13A and 13B schematically illustrate a perspective view and a cross-sectional view for explaining problems in ion implantation incident at a slight angle of inclination.

FIG. 14 schematically illustrates a cross-sectional view for explaining problems in a side wall of a trench in the ion implantation incident at a slight angle of inclination.

DETAILED DESCRIPTION

Figure 1:
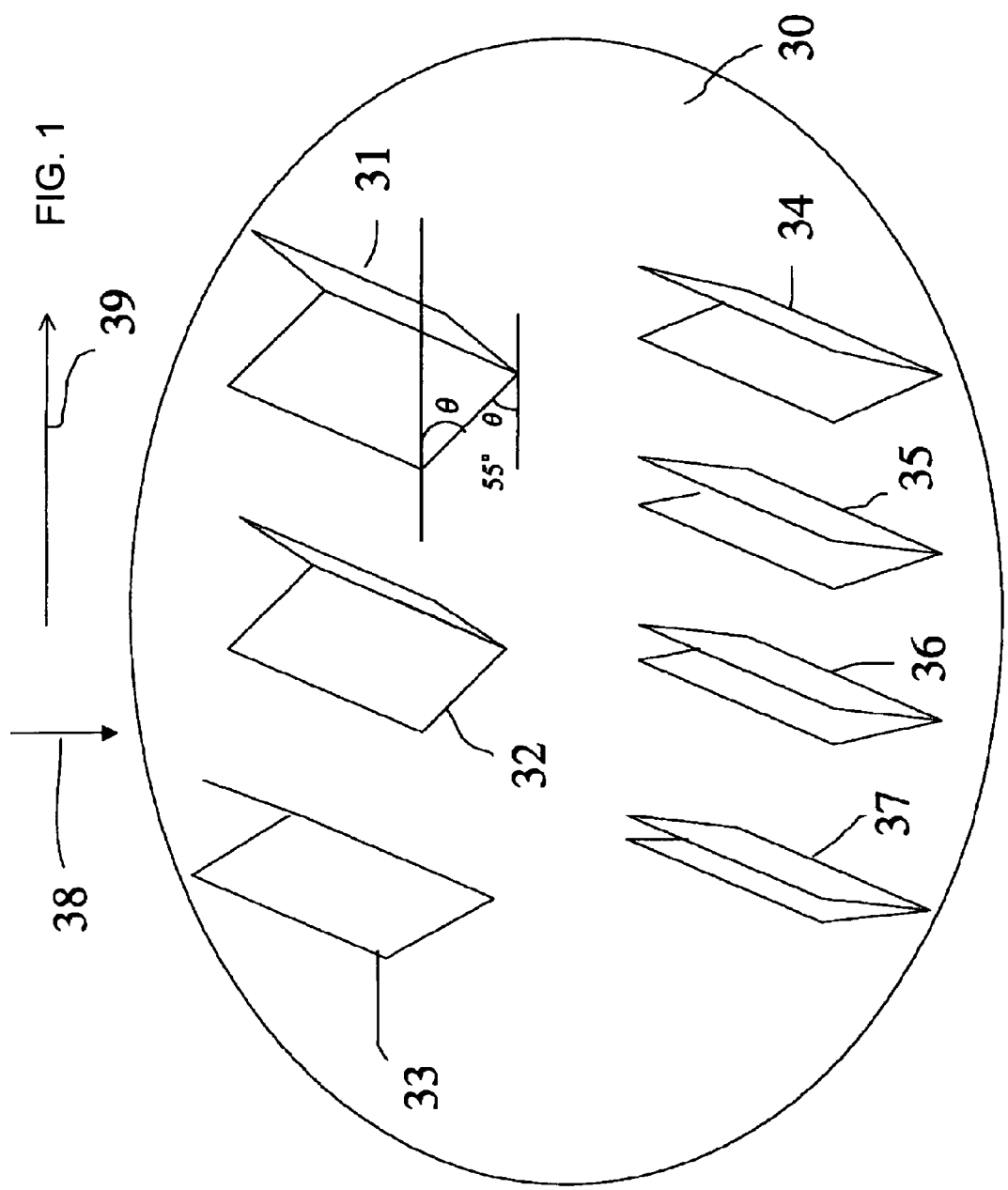
FIG. 1 is a perspective view showing a plurality of trenches, each with a side wall having a different angle of inclination, formed on a surface of a semiconductor wafer according to the present invention.

In the following, preferred embodiments of a method of manufacturing the device according to the invention will be explained in detail with reference to the attached drawings. Here, the explanations will be made in relation to examples in each of which the invention is applied to a reverse-blocking IGBT. In the following explanations and the attached drawings, a leading character "n" or "p" attached to names of layers and regions means that majority carriers in the layers and the regions are electrons or holes, respectively. Moreover, a sign "+" attached to the leading character "n" or "p" means that the layer and the region have a comparatively high impurity concentration, and a sign "−" attached to the leading character "n" or "p" means that the layer and the region have a comparatively low impurity concentration. Furthermore, arrangements denoted with the same reference numerals and signs are similar, so that redundant explanations will be omitted.

In the manufacturing process of the reverse-blocking IGBT, a gate and emitter structure of IGBT on the top surface (first principal surface) side of a wafer is first formed and the bottom surface (second principal surface) side of the wafer is thinned down to a specified thickness. Thereafter, for forming a collector region (an isolation layer) connecting the top surface and the bottom surface, an etching mask is formed on the bottom surface with its pattern made to correspond to the pattern on the top surface by using a double-sided mask aligner. Then, a V-shaped or trapezoid-shaped trench provided on the periphery of a chip is formed by wet anisotropic etching of silicon with an alkaline solution carried out from the bottom surface of the wafer.

Into the side wall of the trench formed by the etching from the bottom surface side of the wafer, a dopant such as boron is introduced by ion implantation. The introduced dopant is then activated by furnace annealing up to 550° C. or laser annealing so that the IGBT structure on the top surface, by which an isolation layer is formed, is not thermally damaged. Thereafter, over the entire bottom surface of the wafer, metal films for a collector electrode is deposited.

When the trench (V-shaped trench) is formed by wet anisotropic etching with an alkaline solution, the side wall of the trench is formed to have a small angle of inclination relative to the top surface of the wafer or a large angle of inclination relative to the bottom surface of the wafer. This also enables a collector diffused layer on the bottom surface of the wafer and an isolation diffused layer on the side wall of the trench to be formed together. After the diffused layers are formed, the metal collector electrode is formed over the entire bottom surface by sputtering or evaporation. This deposits electrode metals on the side wall of the trench. The deposited metals also can serve as a protection film of the isolation diffused layer. Thus, the isolation layer can be formed with no or reduced defects caused by flaws and defects from contaminants.

On the bottom surface of the wafer, an etching mask is formed with its pattern aligned with the pattern on the top surface by using a double-sided mask aligner so that the bottom face of the trench, formed from the bottom surface of the wafer, surrounds an active region on the top surface after etching. For the material of the etching mask, a silicon oxide film or a silicon nitride film can be used, which can be provided by plasma CVD or atmospheric pressure CVD. However, an alkali-resistant resist or an alkali-resistant photosensitive resin also can be conveniently used.

Referring to FIG. 9, which is a schematic perspective view showing wet anisotropic etching of a silicon wafer 28 with an alkaline solution, in the etching process, wet anisotropic etching of silicon with an alkaline solution can be used. For wet anisotropic etching, solutions for silicon, aqueous solutions of alkalis such as KOH (potassium hydroxide), hydrazine, ethylenediamine, ammonia, and TMAH (tetramethylammonium hydroxide) have long been known and widely used. Etching of silicon using these alkaline solutions has anisotropy (dependence on direction of crystal plane of the etching rate of silicon). Specifically, etching rates for a (111) plane, a (110) plane and a (100) plane when a KOH solution is used are in the ratios 1:600:400, by which etching actually stops on a crystal face {111} equivalent to the (111) plane. Thus, it is known that the etching carried out with an etching mask, having openings along the <110> direction and the direction perpendicular to the <110> direction, formed beforehand on the surface of a wafer as the (100) plane allows a V-shaped trench, a trapezoidal-shaped trench, or a pyramid-shaped trench structure to be formed. Moreover, it is known that, by adjusting the width of the opening of the mask 20 or an etching time, the V-shaped trench, a trapezoid-shaped trench, or the pyramid-shaped trench can be formed with an arbitrary depth and an arbitrary size. When the etching is stopped halfway, a trench can be formed with a cross section having an inverted-trapezoidal shape, such as shown in FIG. 9. When the etching is further progressed, the {111} plane of the side wall of the trench is increased. While, the (100) plane at the bottom of the trench is decreased to finally disappear with the {111} planes on both sides intersecting, at which further etching is substantially self-stopped. This causes no variation in the depth of the V-shaped trench even though the etching time varies. Thus, once the opening width of the etching mask 20 is determined, the depth of the V-shaped trench is determined. Specifically, the depth of the V-shaped trench is calculated with ½ of the opening width multiplied by tan 54.7°. The mask 20 can be formed of a silicon oxide or nitride film.

For etching solutions, an aqueous solution of TMAH (tetramethylammonium hydroxide) and an aqueous solution of ammonia are conveniently used because there is no problem of contamination by metallic ions, and an etching rate for silicon oxide film used as a mask is very small. In the method according to the invention, however, the trench is formed by anisotropic etching, at a later stage of the process, after the passivation film is already formed over the IGBT structure to minimize the inclusion contaminants. An aqueous solution of KOH can be used to etch, which shortens the etching time.

Furthermore, a passivation layer formed beforehand in an isolation layer region on the top surface with a silicon oxide film or a silicon nitride film prevents the trench, formed from the bottom surface of the wafer by wet anisotropic etching with an alkaline solution, from being further etched when the bottom of the trench reaches the passivation layer on the top surface of the wafer. Thus, the passivation layer is effective for naturally stopping the etching.

After the V-shaped or the trapezoid-shaped trench is formed by the wet anisotropic etching of silicon with an alkaline solution, boron ions as dopant ions are introduced into the side wall of the trench by ion implantation. Then, heat treatment is carried out to activate the boron ions, by which a $p^+$ diffused layer (the isolation layer) is formed. The boron ions can be implanted into the side wall of the trench with the wafer inclined like in an ordinary ion implantation. However, since the angle of inclination of the side wall is 54.7° relative to the top surface of the wafer or supplementary angle of 125.3° relative to the bottom surface, the implantation can be carried out without angling the wafer to make ions incident perpendicularly to the wafer. Furthermore, the angle of inclination of 54.7°/125.3° causes no extreme difference in effective implanting dose and implanted depth between the bottom surface of the wafer perpendicular to the incident ions and the side wall of the trench inclined to the incident ions. Therefore, it is also possible to combine boron ion implantation for forming the collector diffused layer on the bottom surface of the wafer and boron ion implantation for forming the isolation layer on the side wall of the trench together in a single implantation step. This reduces the number of process steps, which is effective in cost reduction and enhancement of a rate of acceptable products.

Figure 5A:
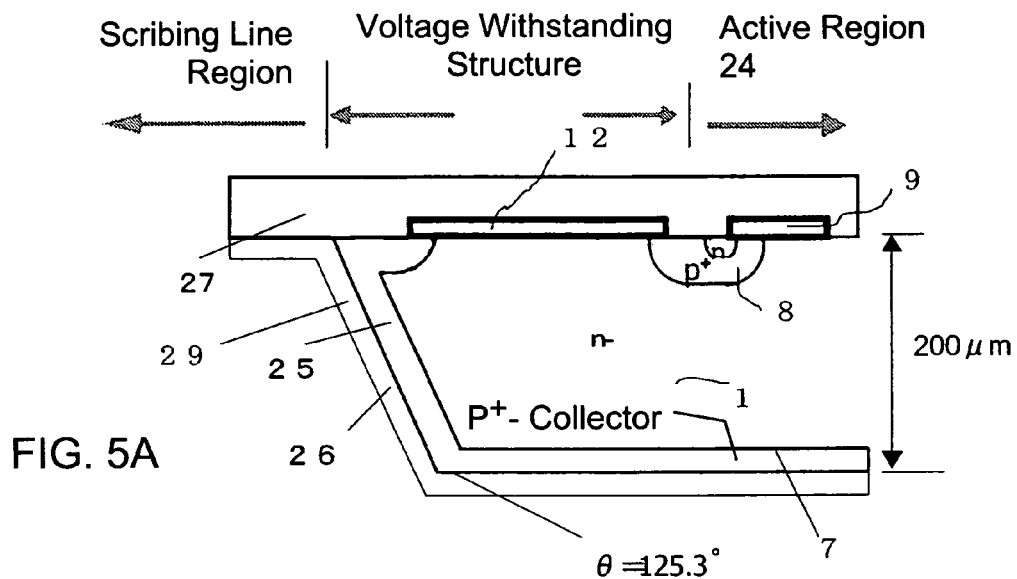
FIG. 5A is an enlarged cross-sectional view showing a section of an isolation layer in one embodiment of a reverse-blocking IGBT according to the present invention.
Figure 5B:
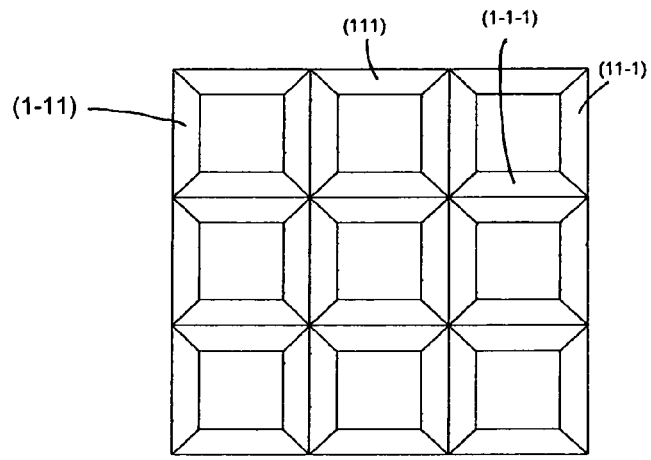
FIG. 5B is a plan view showing a pattern of trenches for nine chips formed by wet anisotropic etching of silicon with an alkaline solution.
Figure 5C:
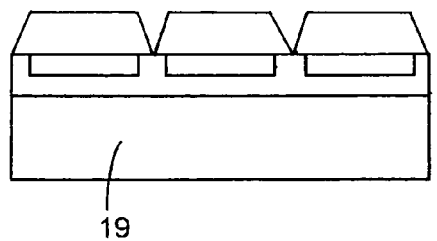
FIG. 5C is a cross-sectional view of FIG. 5B.

FIGS. 5A-5C are cross-sectional views for explaining an example of a reverse-blocking IGBT according to the present invention. FIG. 5A is an enlarged cross-sectional view showing a section of an isolation layer. As is shown in FIG. 5A, on a top surface (upper side of FIG. 5A) of an $n^-$ silicon semiconductor substrate 1 (semiconductor wafer with high resistivity), a plurality of $p^+$ base regions 8 are selectively formed. On a bottom surface (lower side of FIG. 5A) of the substrate 1, a $p^+$ collector layer 7 is formed. The region between the $p^+$ base regions 8 and the $p^+$ collector layer 7 in the direction of the thickness of the substrate is originally the $n^-$ single crystal silicon semiconductor substrate 1, which becomes an n base region. Although not particularly limited, the thickness of the $n^-$ silicon semiconductor substrate 1, that is, the dimension from the first principal surface to the second principal surface, can be 200 μm, for example.

In an active region 24, part of which is shown by an arrow, an n⁺ emitter region 49 is selectively formed in each p⁺ base region 8. On the outside of the active region 24, a voltage withstanding structure is formed as one type of end structures on the surface of a planar p-n junction to ensure a forward-blocking breakdown voltage of the IGBT. The voltage withstanding structure is positioned on the outside of the active region 24 on the top surface. Moreover, the voltage withstanding structure is formed by combining a plurality of stages each including a guard ring of a p⁺ semiconductor region (not shown), an oxide film 12 and a field plate of a metal film which are formed in ring-like on the top surface layer of the n⁻ silicon semiconductor substrate 1.

On the surface of the p⁺ base region 8 positioned between the n⁺ emitter region 49 and the n base region (the n⁻ silicon semiconductor substrate 1), on the surface of the n base region between the p⁺ base regions 8 adjacent to each other, and on the surface of the adjacent p⁺ base region 8 positioned between the n base region and one of the n⁺ emitter regions 49 in the adjacent p⁺ base region 8, a gate electrode (not shown) is formed over these surfaces with a gate insulator film 9 held between the gate electrode and the surfaces. The surface of the n⁺ emitter region 49 is covered with an emitter electrode (not shown). The surface of the p⁺ collector layer 7 is covered with a collector electrode 29. Between the emitter electrode and the gate electrode, an interlayer insulator film is provided.

On the outside of the voltage withstanding structure, a p⁺ isolation layer 25 is formed. The p⁺ isolation layer 25 is formed along a side wall of a trench 26 formed from the bottom surface. The side wall of the trench 26 is inclined at an angle of about 54.7° with respect to the top surface or 125.3° with respect to the bottom surface. Therefore, the p⁺ isolation layer 25 is inclined at an angle of about 54.7°/125.3° with a strip-like cross sectional shape.

With the p⁺ isolation layer 25 thus provided, a depletion layer, spreading before and behind the p-n junction when a reverse bias is applied, can be prevented from spreading over the dicing face as an edge of a chip of the IGBT and a damage region around the dicing face, by which a sufficient reverse breakdown voltage can be obtained. Reference numeral 27 denotes a passivation layer covering the emitter electrode.

In the example, for forming the p⁺ isolation layer 25, the trench 26 is formed in the n⁻ silicon semiconductor substrate 1 by carrying out wet anisotropic etching with an alkaline solution. The trench 26 has a V-shaped or trapezoid-shaped cross sectional shape with the side wall inclined at an angle of about 54.7°/125.3°.

FIGS. 5B and 5C illustrate a plan view and a cross-sectional view, respectively, each showing a pattern of trenches for nine chips formed by wet anisotropic etching of silicon with an alkaline solution. In FIG. 5B, a (100) plane is in the active region 24 of the device, and a (111) plane, a (11$\bar{1}$) plane, a (1$\bar{1}\bar{1}$) plane and a (1$\bar{1}$1) plane form the side wall of the trench 26. FIG. 5C shows a supporting substrate 19.

For wet anisotropic etching solutions for silicon, aqueous solutions of alkalis such as potassium hydroxide, hydrazine, ethylenediamine, ammonia and TMAH (tetramethylammonium hydroxide) are used. Etching of silicon using such solutions are carried out with characteristics that etching rates differ depending on directions of crystal planes of silicon, i.e., with anisotropy. Specifically, in using a solution of potassium hydroxide, for example, the etching rates for a (110) plane and the (100) plane are 600 times and 400 times, respectively, that for the (111) plane. Namely, etching actually stops on a crystal plane equivalent to the (111) plane.

Thus, it is known that the etching, carried out with an etching mask having an opening along the direction of a {110} plane and formed beforehand on a wafer whose surface is the (100) plane, allows a V-shaped trench, a trapezoidal-shaped trench or a pyramid-shaped trench structure to be formed. Moreover, it is known that, by adjusting the width of the opening of the etching mask or an etching time, the V-shaped trench, a trapezoid-shaped trench or the pyramid-shaped pit can be formed with an arbitrary depth and an arbitrary size.

When an opening width of an etching mask 20 is narrow, with the (100) plane at the bottom of the trench 26 disappeared with the {111} planes on both of the opposite sides intersecting at an angle of about 70.6°, further etching is substantially stopped. This causes no variation in the depth of the V-shaped trench 23 even though the etching time varies. When the opening width of the etching mask 20 is wide, the trench 26 can be formed with a cross section having a substantially inverted-trapezoidal shape. In this case, an angle formed by each of the (111) plane, the (1$\bar{1}\bar{1}$) plane and the (1$\bar{1}$1) plane to become the side wall of the trench 26 and the passivation layer 27 exposed by etching is approximately 125.3°. Therefore, photo-resist residues and chemical residues are more easily removed than in the case of the V-shaped trench.

The depth of the V-shaped trench 26 has a value for which ½ of the opening width of the etching mask is multiplied by tan 54.7°. For forming the V-shaped trench 26 so as to have a desired depth, it is necessary only for the opening width of the etching mask to have a value for which the depth of the trench 26 is multiplied by 2/tan 54.7°. For example, when the trench is to be provided with a depth of 200 µm, the opening width of the etching mask can be provided as 283 µm, which is advantageous for reduction of a device pitch. In this case, however, the bottom of the trench 26 forms a somewhat sharp acute angle of about 70.6°. Thus, it is preferable to round the corner of the bottom by carrying out processing such as hydrogen annealing processing, corner rounding oxidation processing, or CDE (Chemical Dry Etching).

In wet anisotropic etching of silicon with an alkaline solution, a large etching mask selectivity allows the masking oxide film to be provided very thin. Even with a silicon oxide film formed by CVD (Chemical Vapor Deposition), a sufficient etching mask selectivity can be obtained, although such a silicon oxide film is a little inferior to a thermal oxide film in film quality (resistance of mask). Thus, a film such as a TEOS (Tetraethylorthosilicate) film formed by reduced pressure CVD or plasma-assisted CVD can be also provided as the masking oxide film.

Since the angle of inclination of the side wall of the trench 26 is relatively large, about 125.3° relative to the bottom surface side, impurity ions can be implanted into the side wall of the trench 26 without inclining the silicon wafer. That is, the ion implantation into the silicon wafer can be carried out at a tilt angle of 0°. In this case, impurity ions can be simultaneously implanted into the four side walls of the (111) plane, the (11$\bar{1}$) plane, the (1$\bar{1}\bar{1}$) plane and the (1$\bar{1}$1) plane by one time ion implantation. Hence, the ion implantation can be easily carried out. Here, however, like in ion implantation into an ordinary trench side wall, impurity ions can be separately implanted into each of the four side walls of the (111) plane, the (11$\bar{1}$) plane, the (1$\bar{1}\bar{1}$) plane and the (1$\bar{1}$1) plane by inclining the silicon wafer Since there is no necessity to thicken the etching mask when the trench 26 is formed, the masking oxide film to be the etching mask can be formed by carrying out thermal oxidation at a temperature lower than that in a related method for a time shorter than that in the related method. This can reduce a problem of increasing the lead time and a problem of causing crystal defects due to oxygen introduction at oxidation. Moreover, in wet anisotropic etching with an alkaline solution, with an etching rate determined very high, etching can be carried out in a batch process. This is very largely effective in lead time reduction and in cost reduction.

In the wet anisotropic etching with an alkaline solution, an etching temperature is as low as 200° C. or below. This causes very small thermal damage that exerts no influence on the dopant profile of the active region 24. Moreover, even though a metal having a comparatively low melting point such as aluminum and a material having poor heat resistance are formed on the silicon wafer before the trench 26 is formed by the wet anisotropic etching, the carried out etching exerts no influence on the metal and the material. Moreover, there is no variation in the angle of inclination of the side wall of the trench 26, so that variations in a dose and in ranges of implanted ions at ion implantation become far small.

Next, an explanation will be made about affixing the passivation layer of the thin semiconductor wafer onto a supporting substrate 19, which can be formed of a material such as quartz glass (a glass wafer) with a double-sided adhesive tape put therebetween. The thin semiconductor wafer and the supporting substrate are combined with a double-sided adhesive tape put between them and pressure is applied on both the thin semiconductor wafer side and the supporting substrate side, or a roller is applied on both of them so that no air-bubbles are contained between affixed faces. Thus, the thin semiconductor wafer and the supporting substrate are affixed together.

The double-sided adhesive tape having a structure in which a thermal foaming tape, which is removable by heating and a UV (Ultraviolet) tape, which is removable by irradiation with ultraviolet light, for example, are affixed with a PET (Polyethylene Terephthalate) film put between. To the thermal foaming tape, the passivation layer of the thin semiconductor wafer is affixed, while, to the UV tape, the supporting substrate is affixed. Although not particularly limited, each of the thermal foaming tape and the UV tape can have a thickness of 50 μm and the PET film can have a thickness of 100 μm, for example. Moreover, the supporting substrate can have a thickness of 600 μm, for example.

Next, between adjacent IGBT chip forming areas in the thin semiconductor wafer, a trench to be a scribing line region is formed by wet anisotropic etching. The bottom of the trench is made to reach the top surface. In this state, even though the trench is formed, the thin semiconductor wafer, being secured to the supporting substrate with the double-sided adhesive tape put between, is not separated into semiconductor chips. The side wall of the trench becomes an edge of an IGBT chip.

Requirements of an etching solution for forming the trench are 3 to 20% in concentration and 50 to 90° C. in temperature in a TMAH (tetramethylammonium hydroxide) aqueous solution. Moreover, requirements can be 1 to 20% in concentration and 50 to 90° C. in temperature in an $NH_4OH$ (ammonia) aqueous solution, and can be 10 to 60% in concentration and 50 to 90° C. in temperature in a KOH (potassium hydroxide) aqueous solution.

The trench thus formed has a shape with its side wall being the {111} plane as explained before because the surface of the thin semiconductor wafer is the {100} plane. The flatness of the {111} plane etched by the wet anisotropic etching is of the order of 1 nm Ra with which the plane becomes very smooth. In the case in which an opening width of a mask is narrow and etching is naturally stopped to form a trench with a V-shaped cross section, the trench is provided so that the bottom of the V-shape reaches the top surface. While, in the case in which the opening width of the mask is wide and etching is stopped halfway to form a trench with an inverted-trapezoid-shaped cross section, the trench is provided so that the bottom of the inverted-trapezoid-shape reaches the top surface.

Thereafter, ion implantation with boron ions is carried out from the bottom surface side of the thin semiconductor wafer onto the side wall of the trench. Then, low temperature annealing is carried out to activate the implanted boron ions, by which an isolation layer is formed. In forming the isolation layer, like in the ion implantation into a vertical trench side wall, the ion implantation can be carried out by dividing the implantation process into four steps each being carried out for the side wall in each of the four directions around a chip with the wafer being inclined in each step. However, since the angle of inclination (an angle of intersection) of a side wall surface of the trench, into which surface ion implantation is carried out, respect to the bottom surface of the wafer is large, about 125.3°, ion implantation can be carried out without inclining the wafer (at a tilt angle of 0° (vertically)). In this case, only one time ion implantation is sufficient, so that the process can be simplified.

In forming a trench by dry etching in the related art, a high aspect ratio of the trench caused reduction in an effective dose, a loss of dose due to presence of a screen oxide film, a loss of dose due to reflection and re-emission of an ion beam, and reduction in an effective projected range. In the example of formation of the trench according to the present invention, however, no such problems are developed because the angle of inclination of the side wall surface of the trench to the bottom surface of the wafer is relatively large, about 125.3°, and the aspect ratio is small. Furthermore, the small aspect ratio facilitates removal of chemicals and residues in the trench, which is largely effective in enhancing yield and improving reliability. The angle of inclination of the V-shaped trench is fixed at 54.7° (an angle of intersection of the top surface of the wafer) as the (100) plane and the {111} plane at which etching is stopped. This causes no variation in the angle of inclination of the side wall. Hence, variations in a dose and ranges of implanted ions at ion implantation become far small.

As an example, the case is given in which boron ions are implanted at $1 \times 10^{15}$ $cm^{-2}$/100 keV at a tilt angle of 0°. A temperature and a time for low temperature annealing carried out after the ion implantation are those which exert no influence on the emitter electrode and the collector electrode having been already formed (at an annealing temperature of 400° C. for an annealing time of 5 hours, for example). Moreover, the flatness of 1 nm Ra of the side wall surface of the trench can ensure formation of the isolation layer with a diffusion depth of 1 μm.

Subsequently, the thin semiconductor wafer, affixed onto a supporting substrate with the double-sided adhesive tape, is heated to remove the thermal foaming tape from the thin semiconductor wafer, by which the semiconductor wafer is separated from the double-sided adhesive tape affixed to the supporting substrate. Moreover, by irradiating the UV tape with ultraviolet (UV) light, the UV tape is removed from the supporting substrate, by which the double-sided adhesive tape is separated from the supporting substrate for reusing the supporting substrate. Here, the removal of the thermal foaming tape is carried out with the supporting substrate put on a hot plate at a raised temperature of the order of 130° C. while being made to come under the semiconductor wafer (to come on a hot plate surface). Since the thickness left at the bottom of the trench is only several micrometers as a total of the thicknesses of the passivation layer 27 and the collector electrode 29, the thermal foaming tape removal from the semiconductor wafer simultaneously allows the semiconductor wafer to be separated into chips. When the wafer fails to break into separated chips, the left coupling section can be preferably cut by such measures as a high-energy laser beam irradiation. Thus, an IGBT chip is formed which is assembled in a package (not illustrated) to be completed as a reverse-blocking IGBT.

Figure 6A:
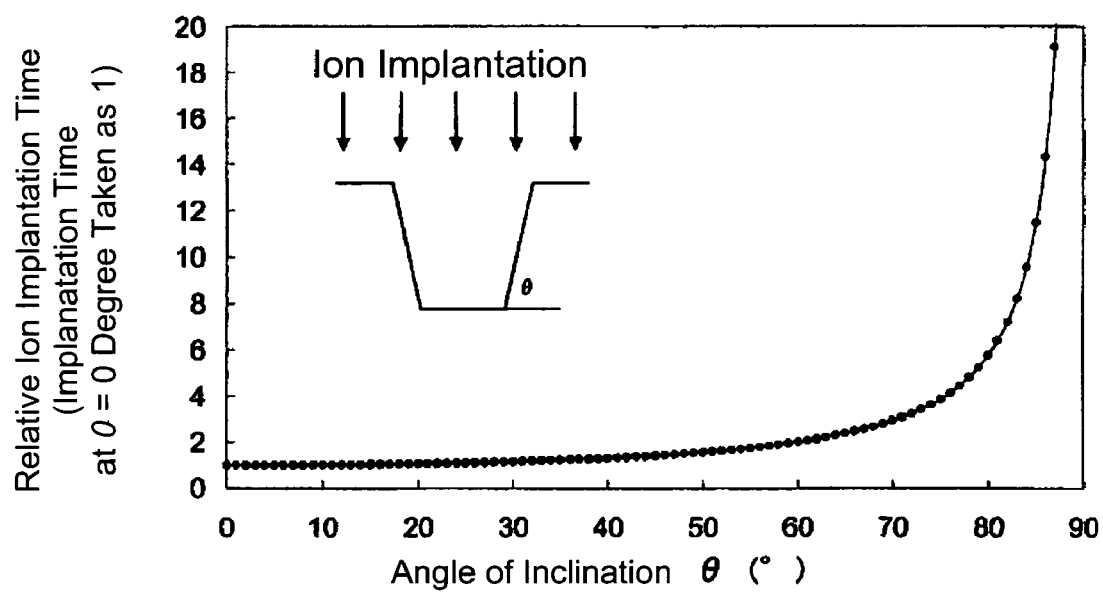
FIG. 6A is a characteristic diagram showing a relationship between an angle of inclination of the side wall of a trench and a relative ion implantation time.

FIG. 6A is a characteristic diagram showing a relationship between an angle of inclination of the side wall of a trench and a relative ion implantation time in which the ion implantation time when the angle of inclination of the side wall is 0° is taken as unity. It is known from FIG. 6A that, in a trench formed by ordinary dry etching with a side wall having a large angle of inclination of 80° or more to the top surface of the wafer, a very long implantation time is required when an ion beam is incident perpendicularly on a wafer.

In Example 1 according to the present invention, a laser beam is operated for activating an ion-implanted layer rather than operated in a work mode. The laser annealing is to be carried out by irradiating the ion-implanted layer with a laser beam having such an irradiation energy density as to make a concentration of implanted dopant ions be at a saturated state. In particular, with a thin wafer device with a substrate thickness of 200 μm or less, by irradiating the ion-implanted layer with a laser beam having such an irradiation energy density as to make the concentration of implanted dopant ions be at the saturated state, the entire surface of the side wall of the trench can be sufficiently activated.

Since a laser is a kind of light, an irradiation energy density on a plane, inclined at an angle of inclination θ to a plane perpendicular to an incident laser beam, is reduced to a value in which, like the irradiation energy density due to a normal light, the irradiation energy density on the plane perpendicular to the incident laser beam is multiplied by cos θ. Therefore, if a plane perpendicular to an incident laser beam (θ=0°) is activated by the laser beam, when a side wall of a trench inclined at an angle of inclination of θ is activated by a laser beam irradiation, the energy of the laser beam is increased by a factor of 1/cos θ. This is to enable a plane inclined at any angle of inclination θ to be activated.

However, when the area to be annealed includes a planar area perpendicular to the laser beam in addition to the inclined side wall of the trench, the planar area or an area irradiated with an excessive irradiation energy density is brought into a state in which a crystal is molten. Otherwise, a work mark appears on a silicon substrate or the silicon substrate is brought into a state of being processed.

Referring to FIG. 1, in Example 1, the manufacturing process of each of the trenches is the same as that previously explained. In the previous explanation, the angle of inclination of the V-shaped trench was fixed at 54.7° of an angle of intersection of the (100) plane and the {111} plane at which etching is stopped. This caused no variation in the angle of inclination of the side wall. Hence, variations in a dose and ranges of implanted ions at ion implantation became far small. However, the directions of crystal planes and the processed planes of wafers being used are not always common to the wafers. In particular, in devices and actuators to which an MEMS (Micro-Electro-Mechanical System) technology is applied, the number of processing making use of planes with various directions of crystal planes tends to increase.

In Example 1, boron ions were implanted at $1 \times 10^{15}$ cm$^{-2}$/50 keV at a tilt angle of 7°. Next, laser annealing was carried out with a YAG2ω double-pulse laser (with a total irradiation energy density of 3 J/cm$^2$ from two laser units (1.5 J/cm$^2$+1.5 J/cm$^2$), an wavelength of 532 nm and a delay time of 300 ns between the two laser units). At ion implantation, an opening of a mask is ideally provided only at a trench section. While, at laser irradiation, the irradiation is ideally carried out only at a section where the trench is formed.

In the arrangement shown in FIG. 1, on the surface of a semiconductor wafer 30, several trenches were formed in which angles of inclination θ of side walls to the wafer surface were varied from one another. Thus formed trenches were irradiated with a laser beam and their respective annealing conditions were studied. In trenches 31, 32, 33, 34, 35, 36 and 37, the angles of inclination θ are given as θ=55°, θ=60°, θ=65°, θ=70°, θ=75°, θ=80° and θ=85°, respectively. Reference numerals 38 and 39 designate the direction of irradiation with the laser beam and the direction of scanning with the laser beam, respectively.

Figure 2A:
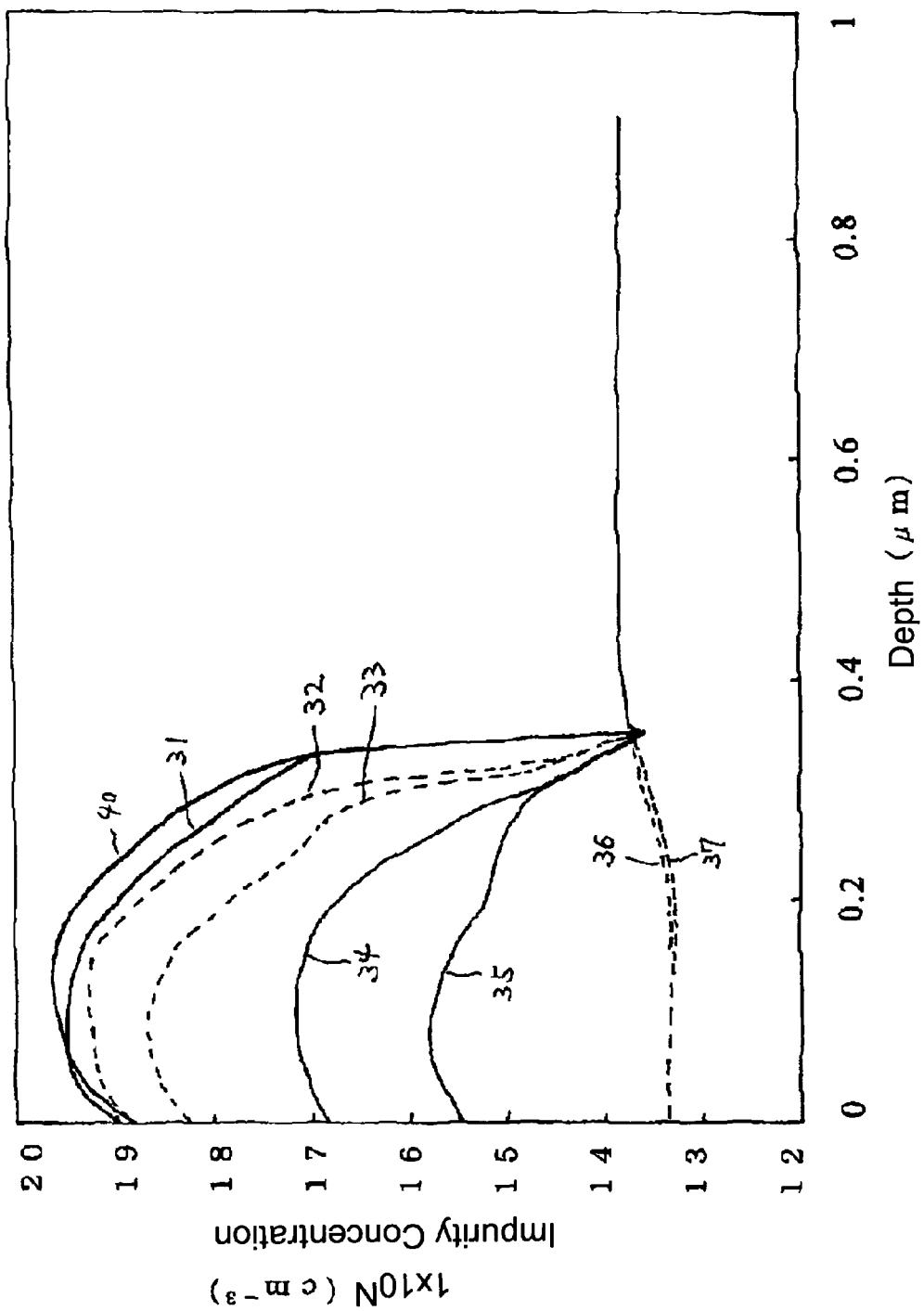
FIG. 2A is a characteristic diagram showing measured impurity concentration profiles by angle of inclination of the trench.

FIG. 2A is a characteristic diagram showing impurity concentration profiles measured by an SR (Spreading Resistance) method, depending on the angle of inclination of the side wall of the trench. Since an actual reverse-blocking IGBT device has a wafer thickness of the order of only 200 μm, in the measurement, the semiconductor wafer 30 having a height of 10 mm or less was prepared to form the trenches 31 to 37. The focal point of the laser beam was made positioned at the bottom of each trench and the SR concentration profile was measured at a position 1 mm or less above the bottom of each trench. Profiles with numerals 31 to 37 are those in the side walls of the trenches 31 to 37, respectively, and the profile with numeral 40 is that in the flat plane as the surface of the semiconductor wafer 30 perpendicular to the laser beam.

From the diagram, it is known that in the surface 40 with θ=0°, the trench 31 with θ=55° and the trench 32 with θ=60°, high impurity concentrations were obtained with the peak of each concentration profile exceeding $1 \times 10^{19}$ cm$^{-3}$, and that even in the trench 33 with θ=65°, a high impurity concentration was obtained with the peak of concentration profile exceeding $5 \times 10^{18}$ cm$^{-3}$. Moreover, it is also known that in trenches from the trench 31 with θ=55° to the trench 34 with θ=70°, peaks of their impurity concentrations exceed $1 \times 10^{17}$ cm$^{-3}$, which are sufficient as concentrations for controlling expansion of a depletion layer in a reverse-blocking IGBT. In the experiments carried out this time, ions were implanted down to the depth of the order of 0.35 μm. However, by increasing implantation energy at ion implantation as necessary, an ion implantation condition hard to be affected by contamination and flaws can be determined.

Figure 2B:
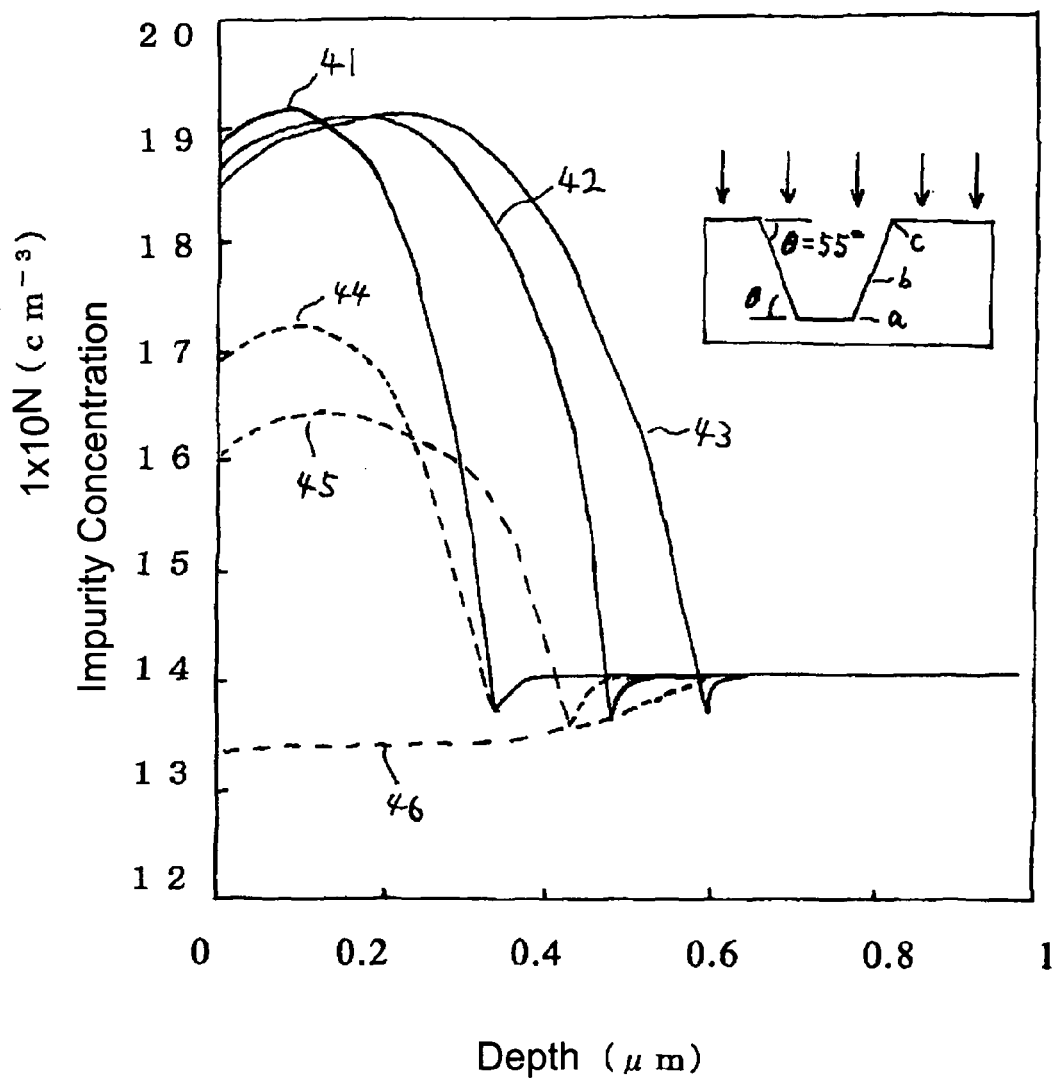
FIG. 2B is a characteristic diagram showing impurity concentration profiles measured at several positions on the inclined side wall of a trench away from the focal point of a laser beam set at the bottom of the trench.

FIG. 2B is a characteristic diagram showing SR impurity concentration profiles measured at several positions on the inclined side wall of a trench away from the focal point of a laser beam set at the bottom of the trench. With an angle of inclination θ taken as 55°, the focal point was set at the bottom "a" of the trench, a position on the side wall of the trench 1 mm away from the bottom was taken as a point "b" and a position 2.5 mm away from the bottom was taken as a point "c". Implantation energies of ions were taken as 50 keV, 100 keV and 150 keV with a boron dose taken as $1 \times 10^{15}$ cm$^{-2}$ and a laser irradiation condition made the same as above.

In FIG. 2B, the concentration profiles with numerals 41, 42 and 43 are those obtained at the point "b" (the position 1 mm away from the focal point) with the implantation energies of 50 keV, 100 keV and 150 keV, respectively. The concentration profiles with numerals 44, 45 and 46 are those obtained at the point "c" (the position 2.5 mm away from the focal point) with the implantation energies of 50 keV, 100 keV and 150 keV, respectively. It is known from FIG. 2B that with implantation energy up to 150 keV, even at a position 1 mm away from the focal point of the laser beam, high concentrations with the peak concentration of $1 \times 10^{19}$ cm$^{-3}$ or more can be obtained. Moreover, it is known that even with implantation energy of 50 keV, a peak concentration of $1\times10^{17}$ cm$^{-3}$ or more is obtained even at a position 2.5 mm away from the focal point. Therefore, it is known that in a wafer with a thickness equal to or less than the above distance (for example, a thickness on the order of 200 μm as being applied to the reverse-blocking IGBT according to the invention), the impurity concentration in the inclined side wall of the trench has no problem in being made as an impurity concentration for forming an isolation layer.

Figure 6B:
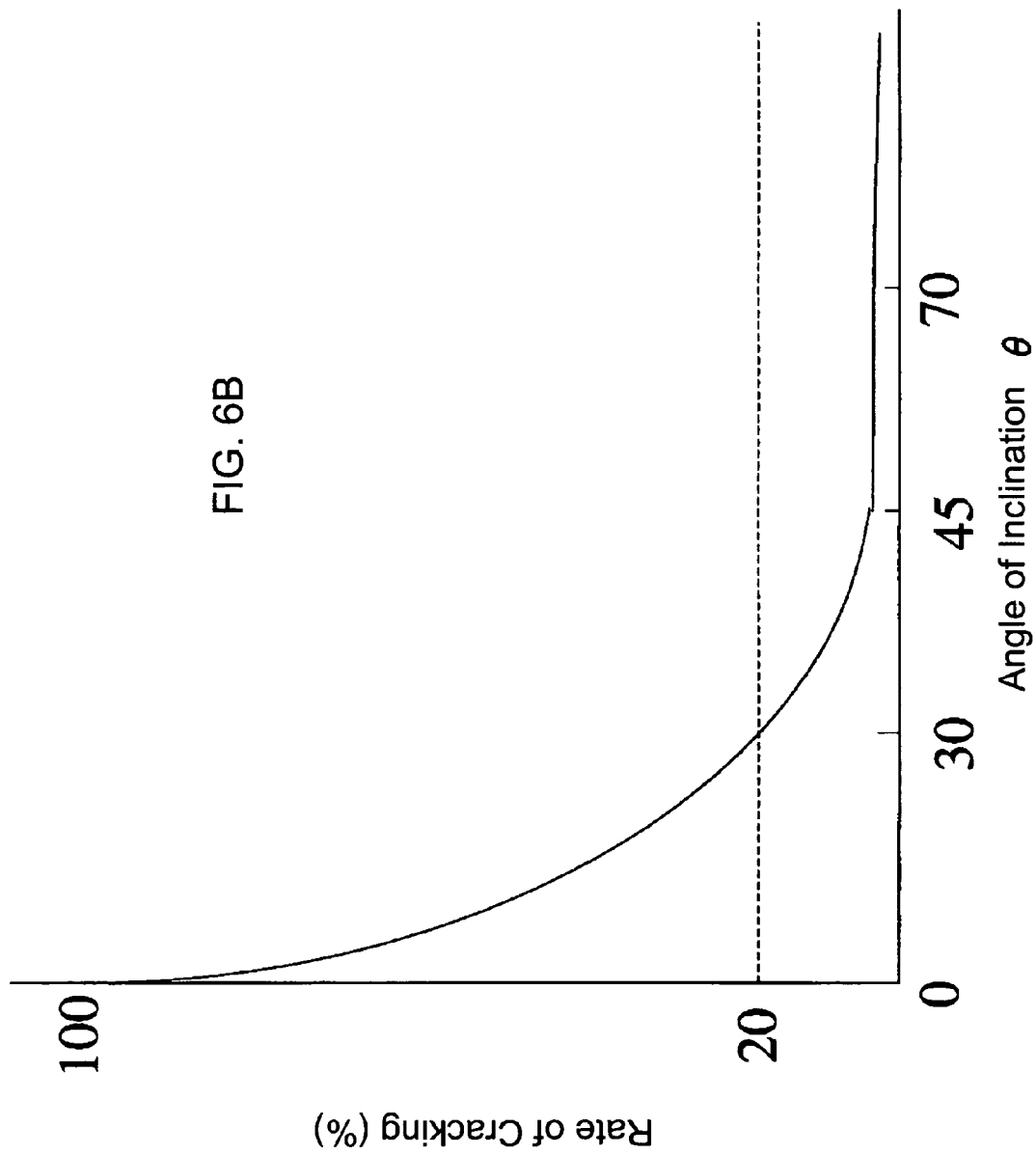
FIG. 6B is a characteristic diagram showing a relationship between the angle of inclination of the side wall of the trench and a rate of cracking of chips.

FIG. 6B is a characteristic diagram showing a relationship between the angle of inclination θ of the side wall of the trench and a rate of cracking of chips. When annealing is carried out by irradiating the side wall of the trench with a laser beam, the smaller the angle of inclination θ is (or larger the supplemental angle 180°-θ is), the more an irradiated surface is activated. That is, the efficiency of activation is the best for the angle of inclination θ given as θ=0° (when the laser beam is projected from the direction perpendicular to the flat plane of the wafer). However, when the case of separating the wafer into individual chips is taken into consideration, at θ<30°, the edge of the chip is formed to have a considerably sharp acute angle, which can cause cracking of the chip. Even though a region with a high impurity concentration is formed at the edge having a sharp acute angle to be provided as a field-stopping layer, the sharper the edge, the more the position causing a crack comes closer to the central part of the chip. Thus, it becomes impossible to limit the cracking within the field-stopping layer only. For the angle of inclination θ given as θ>30°, the rate of cracking of chips becomes 20% or less. Accordingly, the angle of inclination of the side wall of the trench relative to the top surface of the wafer should be taken as 70° or less, and preferably taken as between 30° and 70°.

Example 1 was explained as an example in which laser beam irradiation is applied to activation of dopant ions implanted for forming an isolation layer of a reverse-blocking IGBT device. In Example 2, since a laser is originally a kind of light, an irradiation energy density on a plane, inclined at an angle of inclination θ to a plane perpendicular to an incident laser beam, can be considered to be reduced basically on the cosine law to a value in which, like the irradiation energy density due to a normal light, the irradiation energy density on the plane perpendicular to the incident laser beam is multiplied by cos θ. Therefore, on condition that a plane perpendicular to an incident laser beam (θ=0°) is activated by the laser beam, when a side wall of a trench inclined at an angle of inclination of θ is activated by a laser beam irradiation, the energy of the laser beam is made increased by a factor of 1/cos θ. This is to enable a plane inclined at any angle of inclination θ to be activated.

For example, when a flat plane perpendicular to an incident laser beam can be activated with an energy density of 1 J/cm$^2$, with an energy density given by three times or more, i.e., 3 J/cm$^2$ or more, a plane with an angle of inclination θ up to 70.5° (θ=cos$^{-1}$(⅓)) is to be capable of being activated though losses of the laser beam due to reflection and transmission are not taken into consideration in the expression. With an angle of inclination θ taken as 70° and an energy density of a laser beam taken as 4 J/cm$^2$, the energy density on the irradiated inclined plane is 1.37 J/cm$^2$. When the focal point of the laser beam is set at the bottom of the trench and energy density 4 J/cm$^2$ at the bottom is relatively taken as unity, the energy density 1.37 J/cm$^2$ on the inclined plane is relatively 0.34, i.e., 34%. Thus, when the energy density 4 J/cm$^2$ at the focal point (bottom) is relatively taken as unity, the height of the trench is taken as that at which an energy density of 35% or more of the energy density at the bottom can be ensured.

Figure 2C:
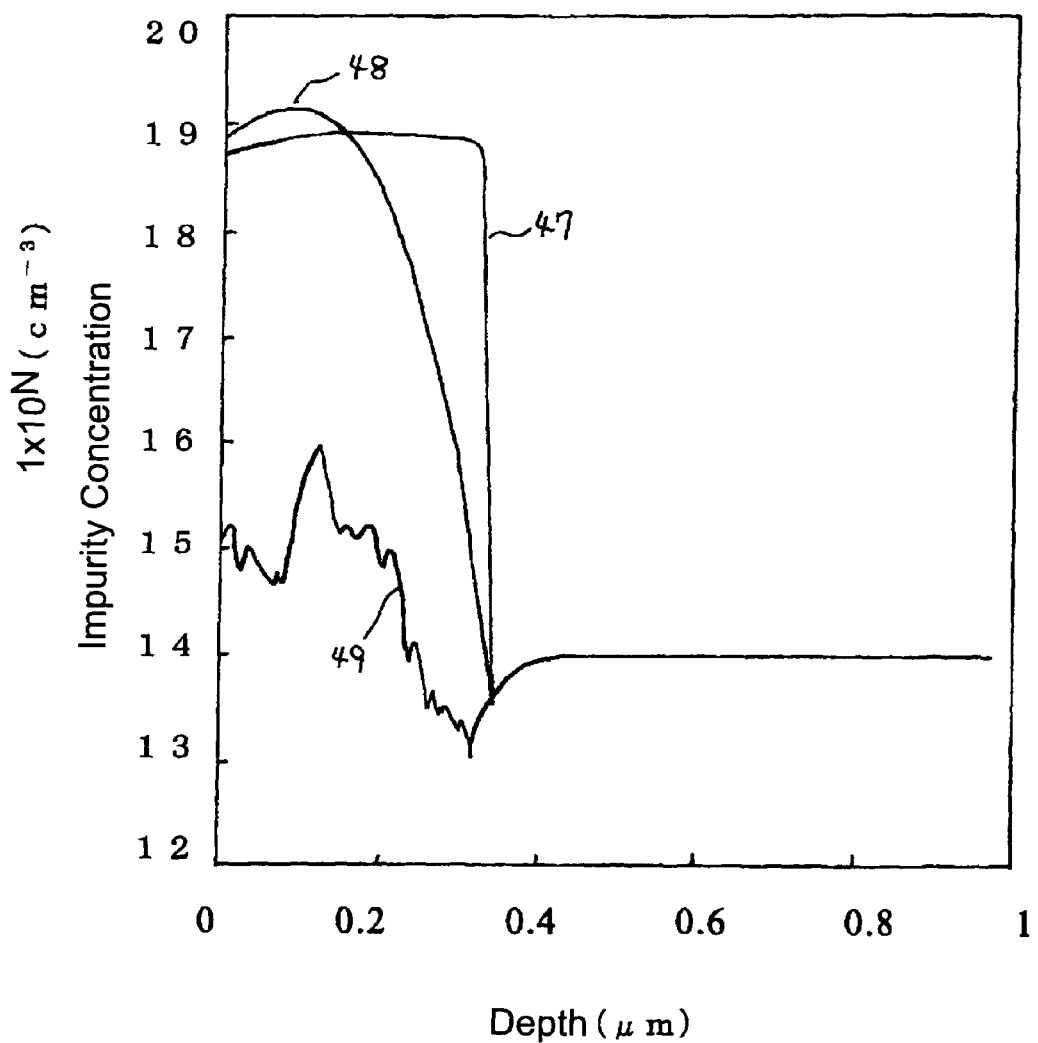
FIG. 2C is a characteristic diagram showing measured impurity concentration profiles in the depth direction measured by irradiation energy density.

In Example 2, calculation exhibits that with the irradiation energy density taken as, for example, 4 J/cm$^2$ and 6 J/cm$^2$, the inclined plane can be activated at an angle of inclination θ up to θ=75.5° and θ=80.4°, respectively. In Example 3, however, as shown in FIG. 2C, which is a characteristic diagram showing impurity concentration profiles in the depth direction measured by irradiation energy density, high irradiation energy densities affect impurity concentration profiles. FIG. 2C shows results of measurements of impurity concentration profiles in which a surface, implanted with a high dose of boron ions with relatively low implantation energy such as 50 keV as in Example 1, was irradiated with laser beams with respective irradiation energies taken as 4 J/cm$^2$ (profile 47), 3 J/cm$^2$ (profile 48), and 6 J/cm$^2$ (profile 49). Irradiation with the energy density of 4 J/cm$^2$ causes the boron ion implanted surface to initiate melting, by which the profile 47 is exhibited as becoming box-shaped profile that is different from the profile 48 obtained by irradiation with an energy density of 3 J/cm$^2$. Moreover, irradiation with the energy density of 6 J/cm$^2$ causes the irradiated surface to be completely molten to make a p boron implanted layer with a thickness of the order of 0.3 μm disappear. Hence, the impurity concentration on the surface side can be reduced. Therefore, the irradiation energy density must be determined to be on a level that causes no melting of an irradiated surface while being on cosine law. When a YAG2ω double-pulse laser is used, its irradiation energy density must be determined to be 4 J/cm$^2$ or below.

Moreover, in a reverse-blocking IGBT with the isolation layer formed by the above isolation layer forming method, an adverse effect due to oxygen can be eliminated more than in an IGBT in which the isolation layer is formed by a coating and diffusion method, so that a far excellent rate of acceptable products (>90%) can be ensured.

FIG. 2D is a characteristic diagram showing results of carrier concentration profile measurements respectively carried out about the flat plane section and the trench side wall section of a wafer with a V-shaped trench formed by wet anisotropic etching with an alkaline solution. On the entire surface of a wafer with a V-shaped trench formed by wet anisotropic etching with an alkaline solution, boron ions were implanted with implantation energy of 45 keV and a dose of $1\times10^{15}$ ions/cm$^2$ at a tilt angle of 0° (with the ion beam made incident perpendicularly to the wafer). Thereafter, the entire surface of the wafer was annealed by irradiating with a YLF2ω double-pulse laser annealing device with an irradiation energy of 1.4 J/cm$^2$×2 and a delay time of 300 nsec for the second pulsed laser irradiation. Since boron ions as dopant ions implanted into the side wall of the trench are activated by the laser annealing, an isolation layer can be obtained with an impurity concentration exceeding $1\times10^{19}$ cm$^{-3}$, and a depth on the order of 1 μm. Thus obtained isolation layer, being harder to be depleted than an isolation layer obtained in the case when low temperature annealing is used, can enhance a yield of the product that meets the reverse breakdown voltage specification. The reason that the impurity concentration becomes higher than that in the case when low temperature annealing is used is that silicon can be made instantaneously molten and recrystallized at a very high speed of several meters per second.

Furthermore, the laser annealing exerts influence of heat only on a region near the irradiated surface. Therefore, no thermal damage is added again to the device, so that the laser annealing is provided as a good method. Like in the boron ion implantation for forming the collector diffused layer, the irradiation of the entire wafer surface enables the flat plane section and the trench side wall section to be simultaneously subjected to activation processing. Laser annealing can be carried out by laser irradiation onto a part desired to be irradiated by covering the other parts with masks, such as formed of SUS, or by partially irradiation onto the desired parts. The partial irradiation laser annealing is a method of partially carrying out annealing by making a laser beam carry out partial scanning or by controlling laser irradiation with a shutter, which can be opened and closed while laser beam scanning is carried out. In a reverse-blocking IGBT, formation of an isolation layer can be carried out by using the laser annealing when electrical characteristics such as breakdown voltages can be ensured in a wafer with a thickness down to 1 mm.

Here, in the laser annealing process, the laser annealing is carried out with the irradiation being made to leave no work mark (in a state of no work mode). An irradiation energy density at this time is 2 J/cm$^2$ or less per one unit, and with a laser beam of a YLF2ω laser or a YAG2ω laser, an irradiation energy density is 0.25 to 5.0 J/cm$^2$. It is adequate to carry out a whole surface irradiation with such an energy density with a delay time of irradiation between two units given as 0 to 5000 ns. In the laser dicing process, the dicing is carried out with the irradiation being made to enter a work mode. For bringing the irradiation into the work mode, it is necessary only that the irradiation energy density be brought to be 2 J/cm$^2$ or more per one unit. When cutting of a metal electrode with a thickness of several micrometers is carried out, an adequate irradiation energy density is on the order of 3 J/cm$^2$ per one unit.

The examples according to the invention were described as being carried out by using a YAG2ω double-pulse laser. However, a YLF2ω laser (at a wavelength of 527 nm), a YLF2ω double-pulse laser, an excimer (such as XeF and XeCl) laser, a YAG3ω laser or a semiconductor laser can be used with their respective irradiation energy densities adjusted. Of the above lasers, the XeCl laser (at a wavelength of 308 nm) with an irradiation energy density being 1.4 J/cm$^2$ or more forms a work mark. Therefore, the irradiation energy density of the XeCl laser must be taken as 1.4 J/cm$^2$ or less.

The ion implantation condition and the laser annealing condition are conditions for forming the collector diffused layer on the bottom surface of the wafer. However, since an angle of inclination of the trench to the top surface of the wafer is 54.7°/125.3°, a sufficient amount of dose of dopant ions is also introduced into the side wall of the trench. Moreover, energy absorption into the side wall at the laser annealing is also sufficient for activating dopant ions introduced into the side wall. Namely, with conditions for ion implantation and laser annealing being the same as those for forming the p collector diffused layer on the flat bottom surface, formation of the p isolation diffused layer on the inclined surface of the side wall of the trench can be carried out simultaneously. Here, referring to FIG. 9, although the dose and range of dopant ions implanted into the side wall of the trench are reduced from unity to an amount of cos 54.7° (about 0.58) compared with the dose and range of dopant ions implanted into the flat bottom surface, they are sufficient for achieving a reverse-blocking capability in a reverse-blocking IGBT and causes no problem. The angle of inclination of 54.7°/125.3° of the side wall of the trench enables activation of the isolation layer and the collector layer to be carried out together also by laser annealing. This is effective in reducing cost and enhancing the rate of acceptable products.

By carrying out the above-described laser annealing treatment, boron atoms are activated and introduced into the isolation layer on the side wall of the trench on the bottom surface and the collector layer in the flat plane section of the bottom surface. The activation of the isolation layer and the collector layer can be also carried out simultaneously with activation treatment of the dopant atoms carried out by furnace annealing at a relatively low temperature (up to 550° C.).

Since the isolation diffused layer and the collector diffused layer are formed from the bottom surface side after the MOS gate structure on the top surface side is formed, the process step of forming the collector metal electrode on the bottom surface can be carried out with the trench made left open without being filled. This allows the side wall of the trench to also have the metal film deposited which can be made to function as a protection film of the side wall of the trench.

The formation of the trench, having a relatively large angle of inclination, about 125.3°, relative to the bottom surface side, by wet anisotropic etching with an alkaline solution is effective in enabling significant reduction of spacing between chips, i.e., a device pitch. Furthermore, the trench reaching the top surface makes the dicing process unnecessary to allow reduction of defects due to dicing.

Figure 4A:
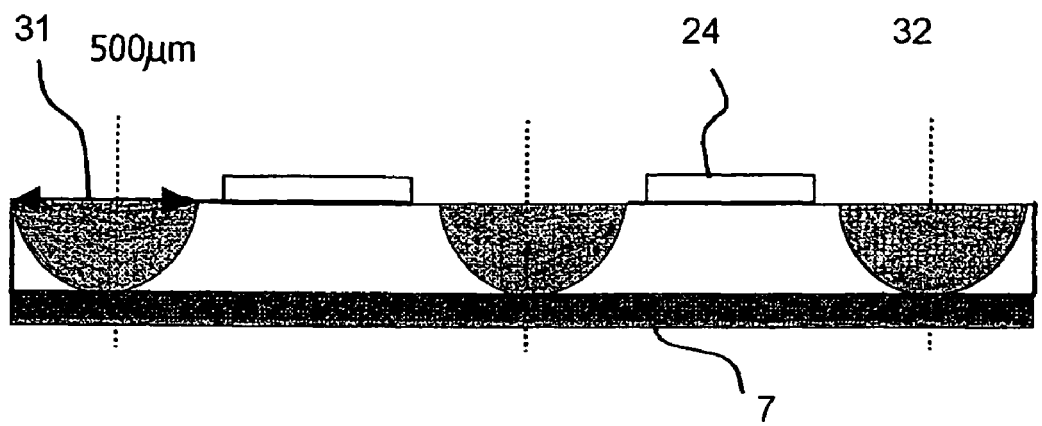
FIG. 4A is a schematic cross-sectional view showing a width of an isolation layer provided by coating and diffusion and a device pitch in a wafer in the related art.
Figure 4B:
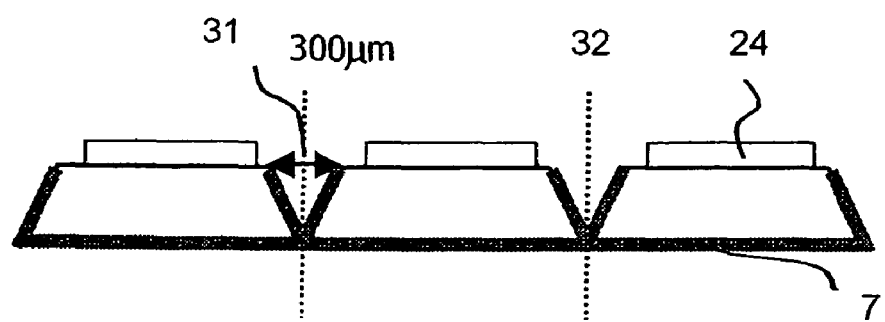
FIG. 4B is a schematic cross-sectional view showing a width of an isolation layer and a device pitch when forming a V-shaped trench from the top surface of a wafer.
Figure 4C:
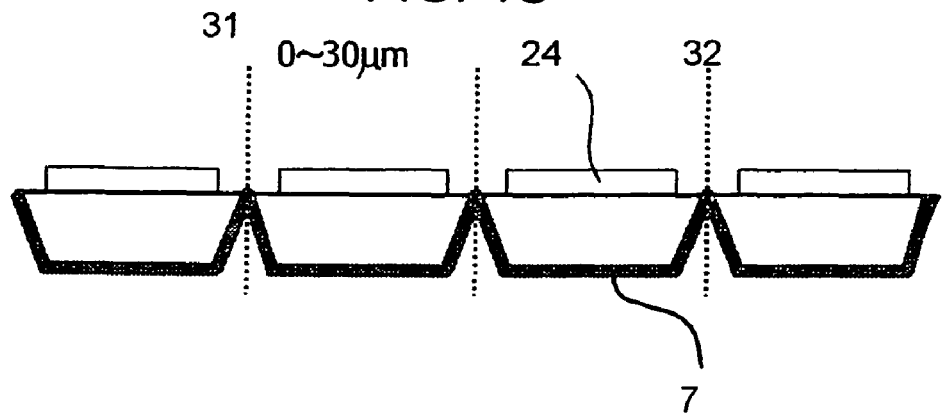
FIG. 4C is a schematic cross-sectional view showing a width of an isolation layer and a device pitch when forming a V-shaped trench from the bottom surface of a wafer according to the present invention.

FIGS. 4A to 4C are schematic cross-sectional views showing comparison of the present invention and the related art for reducing a device pitch. FIG. 4A is a schematic cross-sectional view showing a width of an isolation layer provided by coating and diffusion in a wafer in the related art, where the width 31 of the isolation layer is 500 μm. FIG. 4B is a schematic cross-sectional view showing the case of forming a V-shaped trench from the top surface of a wafer, where the width 31 of the isolation layer is 300 μm. FIG. 4C is a schematic cross-sectional view showing the case of forming a V-shaped trench from the bottom surface of a wafer, in which the width 31 of the isolation layer is 0 to 30 μm. For defining the top surface and the bottom surface of the wafer, a collector diffused layer 7 and an active region 24 are shown schematically. Reference numeral 32 denotes a dicing line when the wafer is separated into chips.

In the wafer shown in FIG. 4C, with variation in the wafer thickness, that is, variation caused in processing such as back grinding, being zero, the spacing between chips adjacent to each other can be made zero. In actuality, however, as shown in FIG. 4D, which is a partial cross-sectional view illustrating effect of variation in the thickness of a wafer on spacing between chips, variation of ±10 μm can occur in back grinding to the thickness of a wafer set at 200 μm. Namely, the thickness of the wafer varies in the range from 190 μm to 210 μm, which causes variation of 15 μm in the spacing between chips. Therefore, a device pitch taken with a margin of approximately 30 μm effectively reduces a rate of defective products and still provides the largest possible number of chips. The state is schematically shown in FIGS. 7A-7D. FIGS. 7A and 7B illustrate a plan view and a cross-sectional view in which the spacing between chips is increased in anticipation of variations caused in alignment and in back grinding. FIGS. 7C and 7D illustrate a plan view and a cross-sectional view in the spacing between chips is lessened with such variations being reduced.

Figure 8A:
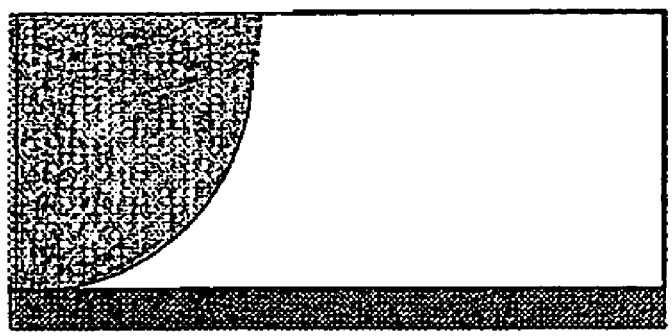
FIG. 8A is a schematic cross-sectional view showing a reverse-blocking IGBT chip according to related art separated at an isolation layer formed by coating and diffusion to have an edge of the bottom surface forming a right angle.
Figure 8B:
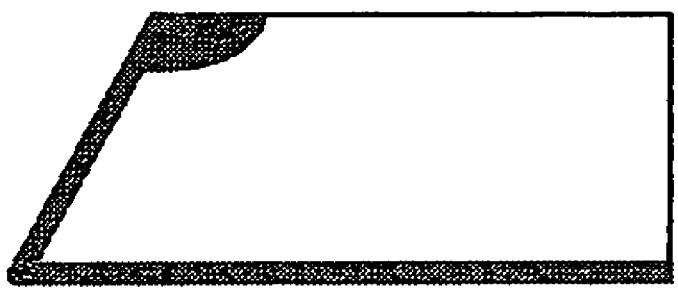
FIG. 8B is a schematic cross-sectional view showing a reverse-blocking IGBT chip according to related art separated at a V-shaped trench formed from the top surface to have an edge of the bottom surface forming an acute angle.
Figure 8C:
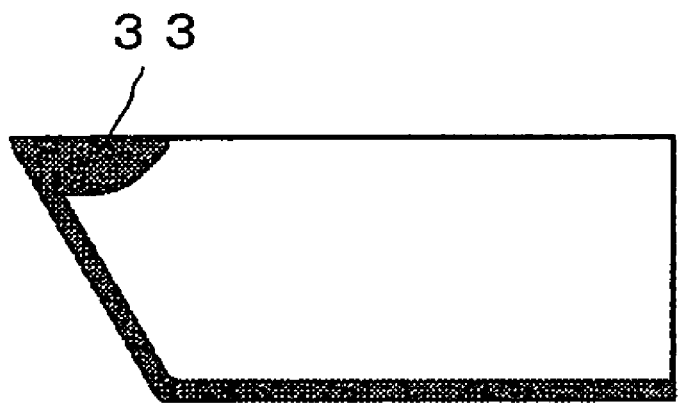
FIG. 8C is a schematic cross-sectional view showing a reverse-blocking IGBT chip according to the invention separated at a V-shaped trench formed from the bottom surface to have an edge of the bottom surface forming an obtuse angle.
Figure 10:
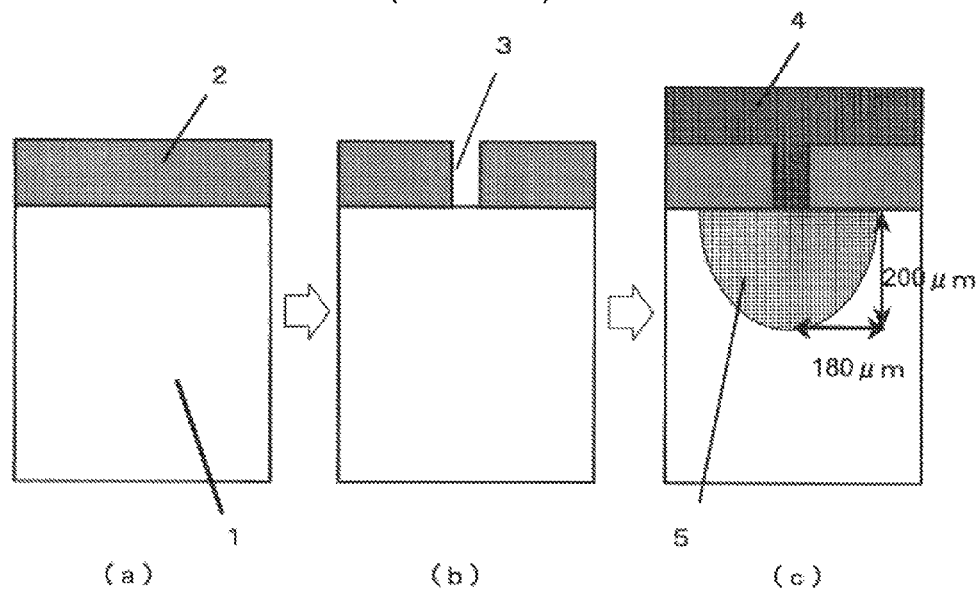
FIG. 10 schematically illustrates the manufacturing steps for forming a principal part of a related reverse-blocking IGBT.
Figure 11:
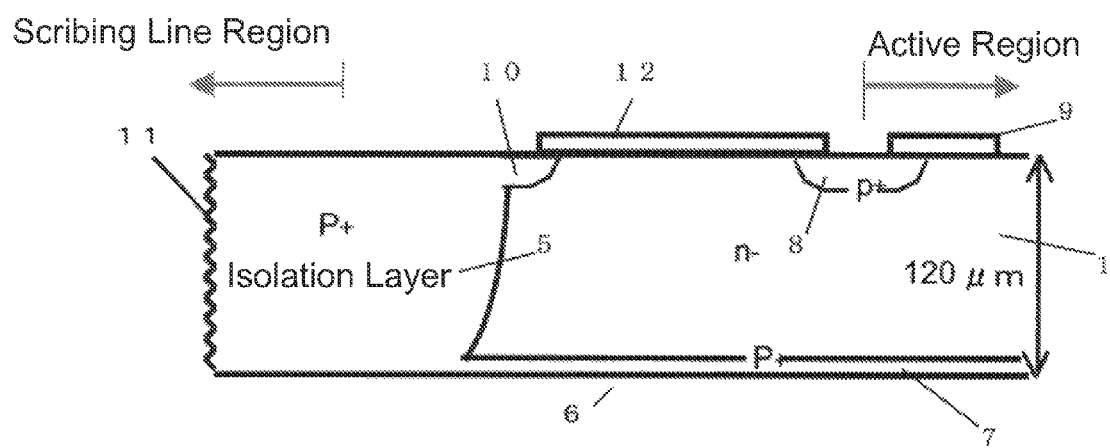
FIG. 11 is a cross-sectional view showing a principal part of the related reverse-blocking IGBT whose isolation layer is formed according to the manufacturing steps shown in FIG. 10.
Figure 12A:
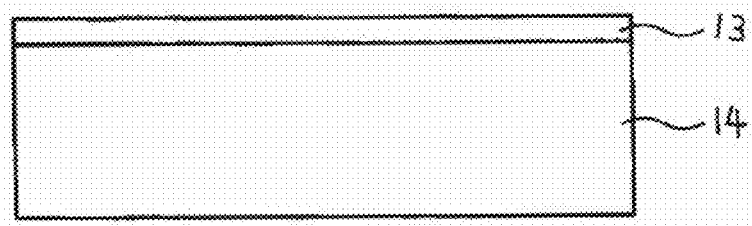
FIG. 12A is a cross-sectional view showing a principal part of another related reverse-blocking IGBT at the manufacturing step in another related manufacturing method at which step an oxide film as an etching mask is formed on a semiconductor wafer.
Figure 12B:
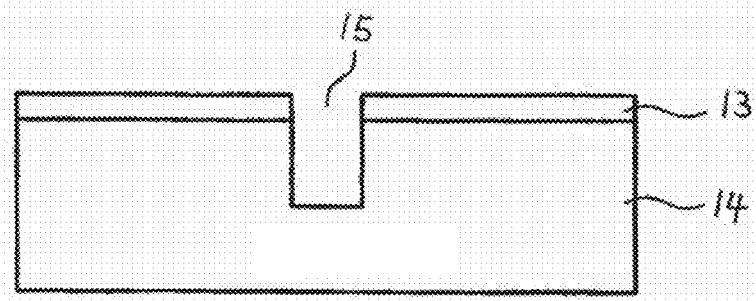
FIG. 12B is a cross-sectional view showing the principal part of the related reverse-blocking IGBT at the manufacturing step next to the step shown in FIG. 12A at which a trench is formed by dry etching.
Figure 12C:
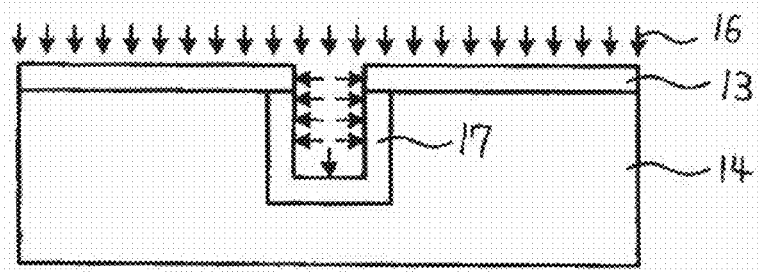
FIG. 12C is a cross-sectional view showing the principal part of the related reverse-blocking IGBT at the manufacturing step next to the step shown in FIG. 12B at which an isolation layer is formed on a side wall of the trench by vapor phase diffusion.
Figure 12D:
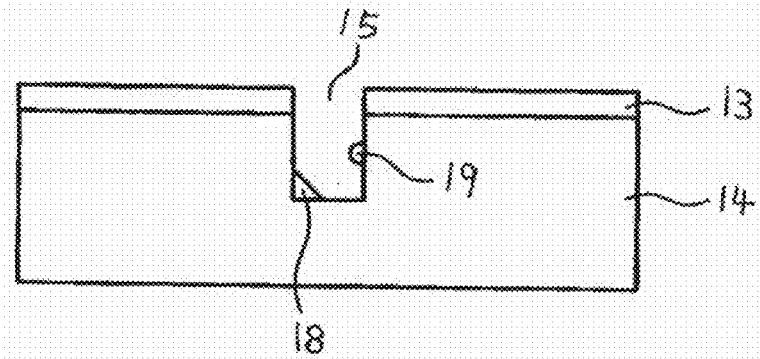
FIG. 12D is a cross-sectional view showing the principal part of the related reverse-blocking IGBT at the manufacturing step shown in FIG. 12B with a chemical residue and a photo-resist residue being left in the trench formed by dry etching.

FIGS. 8A-8C are schematic cross-sectional views for explaining resistance to occurrence of cracking and the degree of tendency of causing electric field concentration at the edge of the bottom surface with chips in related art in comparison with the chip formed according to the present invention. Cross sections of the ends of the separated chips are schematically shown in FIGS. 8A-8C, corresponding to the wafers shown in FIGS. 4A-4C, respectively. In a reverse-blocking IGBT chip according to related art shown in FIG. 8A separated at an isolation layer formed by coating and diffusion, the edge of the bottom surface forms a right angle. In a reverse-blocking IGBT chip according to related art shown in FIG. 8B separated at a V-shaped trench formed from the top surface, the edge of the bottom surface forms an acute angle. This is liable to cause defective chips due to cracking and tends to cause high electric field concentration at the edges of the bottom surfaces.

In comparison, in a reverse-blocking IGBT chip separated at a V-shaped trench formed from the bottom surface according to the present invention shown in FIG. 8C, the edge of the bottom surface forms an obtuse angle of about 125.3°. This significantly reduces production of defective chips due to cracking at the edges of the bottom surfaces. Moreover, the degree of tendency of causing electric field concentration at the edge of the bottom surface is reduced to produce an effect of enhancing a breakdown voltage. In return for the edge of the bottom surface forming an obtuse angle of 125.3°, the edge of the top surface forms an acute angle of 54.7° to raise the possibility of causing a defect due to damage. The edge of the top surface, however, is formed as an end section of the surface of a voltage withstanding structure with a p-layer of a high impurity concentration formed at an early stage of IGBT fabrication process by introduction of dopant such as ion implantation and diffusion on the IGBT surface. Therefore, device characteristics are not largely affected even though defects due to flaw or cracking are possible. The p-layer 33 with the high impurity concentration is sufficiently provided with a depth of approximately 5-30 μm, which can be formed by diffusion carried out beforehand in the previous processing step.

For the etching mask used in the wet anisotropic etching with an alkaline solution, a silicon oxide ($SiO_2$) film or a silicon nitride ($Si_3N_4$) film can be used. In wet anisotropic etching of silicon with an alkaline solution, very high etching mask selectivity is obtained. Therefore, even with an $SiO_2$ film formed by CVD being generally inferior to a thermal oxide film in film quality (resistance of mask), a sufficient etching mask selectivity can be obtained. Thus, in addition to a silicon oxide film or a silicon nitride film formed by plasma CVD or normal pressure CVD, material such as an SOG (spin-on-glass) film, alkali resistant resin or alkali resistant resist can be used as etching mask material. This is effective in that occurrence of crystalline defects and thermal donors is significantly inhibited which was caused by heat treatment at an elevated temperature for a long time due to the coating and diffusion which became the problems in the related art. Moreover, a temperature for forming the etching mask material can be lowered, at a room temperature to 500° C. This enables the trench formation processing to be carried out at a later stage of the wafer formation process without causing thermal damage to an aluminum electrode formed on the top surface.

In the formation of a trench by dry etching as prior art, a very small etching rate, namely 2 μm/min, and processing usually carried out by a single wafer processing etching system make the formation of the trench take a very long time. While, in the wet anisotropic etching with an alkaline solution, a method referred to as batch processing is possible that processes several to tens of wafers at a time and etching rate can also be set very high, which is very largely effective in reducing the lead time and the cost. Since the wet etching is usually carried out at 100° C. or below, even though a metal with relatively low melting point, such as aluminum or a material that is not heat resistant, is already formed on a wafer, the etching exerts no influence on them.

The angle of inclination of the side wall of the trench is relatively large, about 125.3° relative to the bottom surface side in comparison with the angle of inclination of the trench formed by dry etching. This can inhibit reduction in an effective dose, a loss of a dose due to presence of a screen oxide film, a loss of a dose due to reflection and re-emission of an ion beam, and reduction in an effective projected range that occur in the case when impurity ions are implanted perpendicularly to the wafer. Furthermore, the large angle of inclination of the trench allows sufficient energy to be absorbed in the side wall of the trench to make it possible to activate dopant even in laser annealing in which a laser beam is made incident perpendicularly to the wafer. Since ion implantation and heat treatment to the collector layer and the isolation layer can be carried out at the same time, an effect is produced in which a cost is reduced, the number of process steps is reduced and a rate of acceptable products is increased.

After the isolation layer and the collector layer are formed, the process step of forming the bottom surface collector metal electrode is carried out. This allows the side wall of the trench to also have the metal film deposited thereon. The metal film functions as a protection film of the side wall of the trench to thereby reduce occurrence of defects due to cracking and inclusion of contaminant, which is effective in largely enhancing a rate of acceptable products.

FIG. 3 schematically illustrates the manufacturing steps of the reverse-blocking IGBT according to the invention. First, a MOS gate structure 18 is formed on the top surface (first principal) side of a wafer 17 (step (a)). Then, the face of the bottom surface (second principal) side of the wafer 17 is ground thin and is further subjected to etching (step (b)). On the first principal surface side of the thinned wafer 17, a supporting substrate 19, such as a silica glass wafer, is affixed (step (c)). The affixed supporting substrate 19 is remarkably effective for the thinned wafer 17. This is because the supporting substrate 19 affixed to the wafer 17 prevents the wafer 17 itself from warping, deflecting, and cracking. Further, it additionally prevents chips integrally formed to the wafer 17 from being separated into individual ones after etching, and further prevents the MOS gate structure formed on the first principal surface (the top surface) of the wafer 17 from being eroded by etching solution. Thereafter, the affixed wafer 17 and supporting substrate 19 are turned over (step (d)), and the bottom surface etching mask 20 is formed on the second principal surface of the wafer 17 by using a double-sided aligner (step (e)). The alignment with a double-sided aligner is generally carried out so that a mask pattern is aligned on the second principal surface with reference to the pattern on the first principal surface. Therefore, the supporting substrate 19 and an adhesive for bonding the supporting substrate 19 and the wafer 17 are desirably transparent.

The bottom surface etching mask 20 is formed by the double-sided aligner after the supporting substrate 19 is affixed to the wafer 17. However, when alignment can be carried out about the unsupported thin wafer 17 without causing any large warping and deflection, the supporting substrate 19 can be affixed to the wafer 17 after the mask forming step is finished. After the bottom surface etching mask 20 has been formed, a trench 21 is formed by alkaline etching (step (f)). Next, the bottom surface etching mask 20 is removed (step (g)), boron ion implantation is carried out (step (h)), and laser annealing is carried out to form a p isolation layer and a p diffused layer 22 (step (i)). Then, metal films for the collector electrode 23 are formed (step (j)), and the wafer 17 is finally separated to be provided as individual chips (step (k)).

The method according to the invention can reduce contamination of the wafer in comparison with the related method by which, after the trench is formed, the bottom surface of a thick semiconductor wafer is ground and then a bottom surface structure is formed. Moreover, no degradation in characteristics due to oxygen occurs unlike the isolation layer formed by the related coating and diffusion method. Hence, a high rate of acceptable products of 90% or more can be stably obtained. In addition, unlike the related manufacturing process, the step of filling the trench with a reinforcing material can be omitted, which step was carried out for the semiconductor wafer to be diced into chips. Hence, a reverse-blocking IGBT can be provided at a low cost with high reliability.

The flatness of the side wall of the trench is excellent as 1 nm Ra. Therefore, even with the isolation layer having a diffusion depth of the order of 1 μm with an impurity concentration of the order of $10^{18}$ cm$^{-3}$, a depletion layer can be surely stopped. Although boron was used as a dopant for forming the above-described isolation layer, aluminum can be also used. In addition, although the UV tape was used for the adhesive tape on the side of the supporting substrate, a removable tape used in an ordinary grinding process (a back-grinding process) can be used, which can be removed from the supporting substrate by peeling (pulling off).

The angle of inclination of the side wall of the trench to the second principal surface is large in comparison with that of the trench formed by dry etching. This can reduce adverse effects of a related method in ion implantation, namely those such as reduction in an effective dose, a loss of a dose due to presence of a screen oxide film, a loss of a dose due to reflection and re-emission of an ion beam, and reduction in an effective projected range. Furthermore, with the angle of inclination of the side wall of the trench to the second principal surface being large, a chemical residue in the trench can be easily removed, which is largely effective in enhancing yield and in improving reliability.

Furthermore, by carrying out an annealing process after the ion implantation with laser annealing, the impurity can be activated with its temperature instantaneously elevated up to that near the melting point of silicon. Hence, dopant (p-type dopant such as B or Al, for example) ions implanted for forming the isolation layer can be activated more highly than dopant ions annealed by low temperature furnace annealing carried out at a temperature of 500° C. or less. At this time, only the region down to several micrometers from the surface is activated, so that no influence is exerted on and no thermal damage occurs in the already formed electrode.

With the manufacturing method of the semiconductor device according to the invention, an isolation layer can be formed without carrying out high temperature and long time diffusion processing and long time oxidation processing. Moreover, a heat treatment time for forming the isolation layer can be reduced. Furthermore, defects due to crystal defects and defects due to flaws or chippings can be reduced. In addition, process steps for dicing, CMP (Chemical Mechanical Polishing), backfilling with an epitaxial layer, and coating and diffusion can be made unnecessary. Therefore, a production cost can be significantly reduced compared with that in the related art. Further, no OSF and no oxygen donor are produced to make it expectable to reduce a reverse leak current and to enhance a breakdown voltage. Therefore, the invention is effective in that a highly reliable semiconductor device can be obtained at a low cost. Moreover, besides being effective for a reverse-blocking IGBT, the technology in the manufacturing method according to the invention is also effective for actuators and sensors that necessitate having trench structures similar to that of the IGBT formed in activating introduced dopant in the trench surface.

In the wet anisotropic etching with an alkaline solution, the etching mask can be thinned by forming the mask with a silicon oxide film or a silicon nitride ($Si_3N_4$) film having very high mask selectivity. For example, when a silicon oxide film is used for an etching mask and a potassium hydroxide (KOH) aqueous solution is used for an etching solution, mask selectivity is very large as much as 1:350 to 1:500. This allows a silicon oxide film as a mask oxide film to be very thin. Therefore, when a mask oxide film is formed by thermal oxidation, an oxidation temperature can be lowered and an oxidation time can be significantly shortened. This can reduce a problem of increasing a lead time and a problem of causing crystalline defects due to oxygen introduction at oxidation that are experienced in related devices and methods.

Moreover, a silicon oxide film formed by chemical vapor deposition (CVD) has sufficient mask selectivity as an etching mask though such a silicon oxide film is a little inferior to a thermal oxide film in film quality (resistance of mask). Thus, a TEOS (Tetraethylorthosilicate) film or a silicon nitride film formed by reduced pressure CVD or plasma-assisted CVD can be used as an etching mask. In this case, a temperature for forming the film with CVD is as low as 200 to 680° C., so that in the latter part of a wafer forming process, namely after formation of a MOS gate structure, after formation of an emitter electrode or after formation of a surface protection film, a trench for forming an isolation layer can be formed.

In wet anisotropic etching with an alkaline solution, an etching rate can be determined very high. For example, in the case of carrying out etching at 110° C. by using a potassium hydroxide aqueous solution with a concentration of 54 wt %, the etching rate is approximately 8 μm/min. In addition, in wet etching, the etching can be carried out by a system referred to as a batch processing system in which several to tens of wafers can be simultaneously processed, which is very largely effective in lead time reduction and cost reduction.

Moreover, in the wet anisotropic etching with an alkaline solution, an etching temperature is taken at 200° C. or less. This makes a thermal budget so small as to exert no influence on a dopant profile in the active region. Furthermore, even though structures of metals with comparatively low melting points such as aluminum (Al) or of non-heat-resistant materials are formed on the wafer before the trench is formed by the wet anisotropic etching, no influence is exerted on the structures by carrying out the etching.

Moreover, by forming the trench by wet anisotropic etching with an alkaline solution and by thereafter carrying out implantation of boron ions into the side wall of the trench, a heat treatment temperature can be made lower than that in a related method and a heat treatment time can be made shorter than that in a related method. This allows an effect of reduction in the lead time at formation of the isolation layer and an accompanied improvement in the rate of acceptable products. In addition, the taper angle of the side wall of the trench is very large compared with that of the trench formed by dry etching. This can reduce adverse effects of a related method in ion implantation, namely those such as reduction in an effective dose, a loss of a dose due to presence of a screen oxide film, a loss of a dose due to reflection and re-emission of an ion beam, and reduction in an effective projected range. Furthermore, with the taper angle of the side wall of the trench being very large, a chemical and a residue in the trench can be easily removed, which is largely effective in enhancing yield and in improving reliability.

In addition, in the wet anisotropic etching with an alkaline solution, when a mask alignment is arranged in the [110] direction as a crystal orientation equivalent to the <110> direction by using a silicon wafer with the (100) plane, for example, taken as the principal surface, the taper angle of the side wall of the trench is fixed at 125.3°. This gives the effect of making process dependent variation small. Furthermore, by the side wall of the trench fixed at the taper angle of 125.3°, at the time when the etching in progress comes to provide the trench with a V-shaped cross section, the progress of the etching naturally stops. In other words, the depth of the trench is determined by the etching naturally stopping. In other words, the depth of the trench is determined by the opening width of the etching mask. This is effective in making variation in the depth of the trench very smaller than that experienced in a related method.

Furthermore, a thin semiconductor wafer, formed with a top surface structure and a bottom surface structure for forming a reverse-blocking semiconductor chip, is affixed to a supporting substrate, a trench to be a scribing line is formed on the thin semiconductor wafer, an isolation layer is formed on the side face of the trench, and the semiconductor wafer is removed from the supporting substrate to be provided as semiconductor chips. This allows a dicing process as was carried out in the related method to be omitted. Moreover, no coating and diffusion method is used in forming the isolation layer, so that an adverse effect such as degradation in characteristics due to oxygen can be reduced. Therefore, a reverse-blocking semiconductor device with high reliability can be provided at a reduced cost. Furthermore, by using low temperature annealing or laser annealing for activating the dopant in the isolation layer, the isolation layer can be provided as being uniform and shallow in diffusion depth. This allows the area occupied by the isolation layer in the semiconductor chip to be made smaller than the area provided by the related coating and diffusion method, which enables reduction in a device pitch.

For affixing the device to the supporting substrate, a double-sided adhesive tape with a thermal foaming tape and a UV tape bonded together is used. The thermal forming tape is affixed onto the device surface and the UV tape is affixed to the supporting substrate. This makes the double-sided adhesive tape foamed to be easily removed away from the device by heating treatment at a relatively low temperature between 80° C. and 200° C. (for example, at 130° C.).

With the semiconductor device and the manufacturing method of the semiconductor device according to the invention, the trench is formed from the side of the bottom surface as the second principal surface of the silicon semiconductor substrate by wet anisotropic etching with an alkaline solution and impurity ions are implanted into the side wall of the trench. This allows the isolation layer to be formed without carrying out high temperature and long time diffusion processing and long time oxidation processing. Moreover, the isolation layer is formed with the semiconductor substrate affixed to a supporting substrate to thereby allow the isolation layer, connected to the diffused layer on the side of a second principal surface, to be easily formed without causing the wafer to be separated into individual chips flaking off. The width of the isolation layer can be provided as 30 μm compared with 300 μm in a related device and a heat treatment time for forming the isolation layer can be also reduced to 300 nanoseconds from 230 hours for a related device. Furthermore, defects due to crystalline defects and defects due to flaws or chippings can be reduced. In addition, process steps for dicing, CMP (Chemical Mechanical Polishing), backfilling with an epitaxial layer, and coating and diffusion can be made unnecessary. Therefore, a production cost can be significantly reduced compared with that in the related art. Further, no OSF and no oxygen donor are produced and a p-n junction between the isolation layer and the silicon semiconductor substrate forms an obtuse angle to the bottom surface as the second principle surface of the silicon semiconductor substrate to provide a structure in which a bottom surface edge of a chip reduces electric field concentration. Thus, reduction in a reverse leak current and enhancement in a breakdown voltage can be also expected. Therefore, the invention is effective in that a highly reliable semiconductor device with a small device pitch and a chip size can be obtained at a low cost.

The present invention is not limited to the above-explained embodiments but can be variously modified. In the examples, a trench was formed from the bottom surface of a substrate, but the trench can be formed from the top surface of the substrate. Moreover, the first conductivity type was taken as an n-type and the second conductivity type was taken as a p-type. The invention, however, is also valid even though the conductivity types are reversed. Furthermore, the invention can be validly applicable not only to the reverse-blocking IGBT but also to other kinds of reverse-blocking devices and bi-directional devices, or to semiconductor devices such as MOSFETs, bipolar transistors and MOS thyristors, each of whose manufacturing processes is accompanied by formation of an isolation layer, or actuators, sensors or solar cells using an MEMS technology.

As explained in the foregoing, the semiconductor devices and the methods of manufacturing the devices according to the invention are useful for power semiconductor devices used for a system such as a power conversion system, and in particular, are suited for bi-directional devices or reverse-blocking devices, or actuators or sensors using an MEMS technology.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, (1) JP PA 2005-090662 filed on 28 Mar. 2005, (2) JP PA 2005-088479 filed on 25 Mar. 2005, (3) JP PA 2005-017486 filed on 24 Jan. 2005, (4) JP PA 2004-312590 filed on 27 Oct. 2004, and (5) JP PA 2004-240094 filed on 19 Aug. 2004. The disclosures of the priority applications, in their entirety, including the drawings, claims, and the specifications thereof, are incorporated herein by reference.

What is claimed is:

1. A method of manufacturing a semiconductor device having:
   a second conductivity type base region selectively provided in a surface region on a first principal surface of a first conductivity type semiconductor substrate;
   a first conductivity type emitter region selectively provided in a surface region of the base region;
   a MOS gate structure including:
   a gate insulator film provided on a surface of a section of the base region, the section being positioned between the semiconductor substrate and the emitter region; and
   a gate electrode provided on the gate insulator film;
   an emitter electrode in contact with the emitter region and the base region;
   a second conductivity type collector layer provided on a surface of a second principal surface of the semiconductor substrate;
   a collector electrode in contact with the collector layer; and
   a second conductivity type isolation layer surrounding the MOS gate structure, reaching the first principal surface from the second principal surface while being inclined to the first principal surface, and coupled to the collector layer, wherein each of the first principal surface and the second principal surface is a {100} plane, and a surface of the isolation layer is a {111} plane, the method comprising the steps of:

forming the MOS gate structure on the first principal surface of the first conductivity type semiconductor substrate;

covering the second principal surface of the first conductivity type semiconductor substrate with a mask having openings of a desired pattern along the <110> direction;

forming a trench having a V-shaped or trapezoidal-shape cross section in the semiconductor substrate from the second principal surface side, by wet anisotropic etching with an alkaline solution, sections of the second principal surface of the semiconductor substrate not covered by the mask; and forming the second conductivity type isolation layer and a diffused layer on the second principal surface by introducing a second conductivity type impurity into a side wall of the trench and the second principal surface.

2. The method of manufacturing a semiconductor device according to claim 1, wherein the trench is formed so as to be inclined at an angle of 125.3° relative to the second principal surface, and the second conductivity type impurity is introduced into the side wall by ion implantation.

3. The method of manufacturing a semiconductor device according to claim 1, wherein the collector electrode covers the second conductivity type isolation layer.

4. The method of manufacturing a semiconductor device according to claim 1, wherein the mask is made of at least one of a silicon oxide film, a silicon nitride film, an SOG film, and an alkali resistant resist film, wherein the silicon oxide film and the silicon nitride film are formed by plasma or atmospheric pressure CVD, and wherein the SOG film is formed by spin coating.

5. A method of manufacturing a semiconductor device including the steps of:

forming a plurality of diffused layers, a first main electrode and a control electrode on a first principal surface side of a semiconductor wafer;

thinning the semiconductor wafer by grinding a second principal surface of the semiconductor wafer;

affixing the first principal surface side to a supporting substrate with an adhesive layer;

forming a trench that extends to the diffused layer on the first principal surface side from a second principal surface side of the thinned semiconductor wafer;

forming an isolation layer on an entire area of a side wall of the trench and a diffused layer on the second principal surface side on the second principal surface, each of the isolation layer and the diffused layer having the same conductivity type as the diffused layer on the first principal surface side;

forming a second main electrode in contact with the diffused layer on the second principal surface side and the isolation layer; and removing the adhesive layer from the thinned semiconductor wafer to provide the semiconductor wafer as a semiconductor chip.

6. The method of manufacturing a semiconductor device according to claim 5, wherein a crystal face of the second principal surface of the thinned semiconductor wafer is a {100} plane, and a crystal face of the surface of the trench is a {111} plane.

7. The method of manufacturing a semiconductor device according to claim 5, wherein the trench is formed by wet anisotropic etching.

8. The method of manufacturing a semiconductor device according to claim 5, wherein the trench extends to the first principal surface.

9. The method of manufacturing a semiconductor device according to claim 8, wherein the etching of the trench is stopped at a silicon oxide film or a silicon nitride film formed on the first principal surface.

10. The method of manufacturing a semiconductor device according to claim 5, wherein the isolation layer and the diffused layer on the second principal surface side are formed by ion implantation and low temperature annealing at 550° C. or below.

11. The method of manufacturing a semiconductor device according to claim 5, wherein the isolation layer and the diffused layer on the second principal surface side are formed by ion implantation and laser annealing.

12. The method of manufacturing a semiconductor device according to claim 11, wherein the ion implantation is carried out with an ion beam incident onto the second principal surface at an angle of incidence up to ±30° off to the normal to the second principal surface.

13. The method of manufacturing a semiconductor device according to claim 11, wherein the laser irradiation of the laser annealing is carried out with a laser beam incident onto the second principal surface at an angle of incidence up to ±30° off to the normal to the second principal surface.

14. The method of manufacturing a semiconductor device according to claim 13, wherein the irradiation energy density of the laser beam is 0.25 to 5.0 Joule/cm$^2$ from a YLF2ω laser or a YAG2ω laser, with which the entire surface of the second principal surface is irradiated with a delay time for second irradiation given as 0 to 5000 ns.

* * * * *